(12) United States Patent
Ranjan et al.

(10) Patent No.: US 8,687,418 B1
(45) Date of Patent: *Apr. 1, 2014

(54) FLASH MEMORY WITH NANO-PILLAR CHARGE TRAP

(75) Inventors: Rajiv Yadav Ranjan, San Jose, CA (US); Ebrahim Abedifard, Sunnyvale, CA (US); Petro Estakhri, Pleasanton, CA (US); Parviz Keshtbod, Los Altos Hills, CA (US)

(73) Assignee: Avalanche Technology, Inc., Fremont, CA (US)

( * ) Notice: Subject to any disclaimer, the term of this patent is extended or adjusted under 35 U.S.C. 154(b) by 291 days.

This patent is subject to a terminal disclaimer.

(21) Appl. No.: 12/623,369

(22) Filed: Nov. 20, 2009

Related U.S. Application Data

(63) Continuation-in-part of application No. 11/776,692, filed on Jul. 12, 2007, now Pat. No. 8,063,459, and a continuation-in-part of application No. 11/674,124, filed on Feb. 12, 2007.

(60) Provisional application No. 61/116,597, filed on Nov. 20, 2008.

(51) Int. Cl.
*G11C 11/34* (2006.01)
(52) U.S. Cl.
USPC .................................................... 365/185.01

(58) Field of Classification Search
USPC .................................................... 365/185.01
See application file for complete search history.

(56) References Cited

U.S. PATENT DOCUMENTS

| | | | |
|---|---|---|---|
| 2006/0110870 A1* | 5/2006 | Bhattacharyya | 438/197 |
| 2007/0014151 A1* | 1/2007 | Zhang et al. | 365/185.01 |
| 2007/0064468 A1* | 3/2007 | Seol et al. | 365/129 |
| 2007/0082495 A1* | 4/2007 | Mathew et al. | 438/706 |

* cited by examiner

*Primary Examiner* — Hoai V Ho
*Assistant Examiner* — Min Huang
(74) *Attorney, Agent, or Firm* — Maryam Imam; IPxLaw Group LLP

(57) ABSTRACT

An embodiment of the present invention includes a non-volatile storage unit comprising a first and second N-diffusion well separated by a distance of P-substrate. A first isolation layer is formed upon the first and second N-diffusion wells and the P-substrate. A nano-pillar charge trap layer is formed upon the first isolation layer and includes conductive nano-pillars interspersed between non-conducting regions. The storage unit further includes a second isolation layer formed upon the nano-pillar charge trap layer; and at least one word line formed upon the second isolation layer and above a region of nano-pillar charge trap layer. The nano-pillar charge trap layer is operative to trap charge upon application of a threshold voltage. Subsequently, the charge trap layer may be read to determine any charge stored in the non-volatile storage unit, where presence or absence of stored charge in the charge trap layer corresponds to a bit value.

21 Claims, 13 Drawing Sheets

Multi-component target for making Nano-trap layer

Formation of Nano-trap channel film by sputtering through two target

US 8,687,418 B1

FLASH MEMORY WITH NANO-PILLAR CHARGE TRAP

CROSS REFERENCE TO RELATED APPLICATIONS

This application claims priority to previously-filed U.S. Provisional Patent Application No. 61/116,597, filed on Nov. 20, 2008 and entitled "Flash Memory with Nano-Pillar Charge Trap", by Rajiv Ranjan, et al. and is a continuation-in-part application of U.S. patent application Ser. No. 11/674,124, filed on Feb. 12, 2007 by Ranjan et al. and entitled "NON-UNIFORM SWITCHING BASED NON-VOLATILE MAGNETIC BASED MEMORY" and U.S. patent application Ser. No. 11/776,692, filed on Jul. 12, 2007, by Ranjan et al., and entitled "NON-VOLATILE MAGNETIC MEMORY ELEMENT WITH GRADED LAYER".

BACKGROUND OF THE INVENTION

1. Field of the Invention

The present invention relates generally to a non-volatile semiconductor storage unit, and, more specifically, to a non-volatile semiconductor storage unit having a floating gate replacement, and method for making the same.

2. Description of the Prior Art

Computers conventionally use rotating magnetic media for data storage in form of magnetic hard disk drives (HDD). Though widely used and commonly accepted, such hard disk drives suffer from a variety of deficiencies. Access latency, higher power dissipation, increased physical size, and inability to withstand any physical shock justifies a new type of storage device. Other dominant semiconductor based storage devices are dynamic random access memory (DRAM) and static random access memory (SRAM). Both DRAM and SRAM are volatile and very costly but have faster random read/write time HDDs.

Non-volatile or solid-state-nonvolatile-memory (SSNVM) devices, such as NOR/NAND flash, provide higher access times and higher input/output performance (IOP) speed, lower power dissipation, smaller physical size and higher reliability, however usually at a cost which tends to be multiple times higher than HDDs. Although NAND Flash is more costly, it has replaced HDDs in many applications such as digital cameras, MP3-players, cell phones, and hand held multimedia devices.

Currently many devices use combinations of electronically-erasable programmable read only memory (EEPROM)/NOR, NAND, HDD, and DRAM. Including multiple memory technologies in a single product typically adds to the design complexity, time-to-market, and increases cost. For example, the handheld multimedia devices which incorporate NAND Flash, DRAM and EEPROM/NOR Flash are more complex devices to design, have higher costs to manufacture, and take longer to reach the market than devices incorporating fewer memory technologies. As a further disadvantage to such a device, incorporating multiple memories often increases the device's size, reducing its appeal to the consumer.

It is quite clear in the technical community that non-volatile memories are finding increasingly new applications, and this is expected to continue to explode due to the spectacular demands in portable devices. Mobile phones, MP3 players, and other consumer electronics are expected to use increasingly more NVRAM instead of commonly-used NOR-flash memory. Microcontrollers with internal flash, automobiles, and other information processing systems are also expected to replace flash with NVRAM. It is also believed that current volatile DRAM will be replaced by MRAM or spin-torque STTRAM, in the future.

As the process geometry is getting smaller, the design of NAND Flash and DRAM memory is becoming more difficult to scale. For example, NAND Flash has issues related to capacitive coupling, few electrons/bit, poor error-rate performance, and reduced reliability due to decreased read-write endurance. It is believed that NAND flash, especially multi-bit designs, would be extremely difficult to scale below 45 nano meters (nm). Likewise, DRAM has issues related to scaling of the trench capacitors, leading to very complex designs which are becoming very difficult to manufacture and leading to higher cost.

A known problem with manufacturing NAND flash is limitations in size or dimensions of its floating gate. FIG. 1 shows a prior art NAND flash cell. The N-diffusion wells may be formed on a P-substrate, as shown in the example of FIG. 1. Four floating gates are shown, each appearing between two N-diffusion wells and below a polysilicon word line ("Poly WL"). During operation, the floating gate serves to store electrons (charge) for changing the threshold voltage of the corresponding storage unit.

More specifically, in FIG. 1, a prior art memory array 100 made of a multiplicity of storage units (each storage unit being a flash memory), one of which is shown as storage unit 137, with a close-up view 120. Each storage unit 137 comprises two N-diffusion wells 133 formed in P-substrate 138, and a floating gate 135 formed below polysilicon word line 125 and the P-substrate 138, as better shown in cross-sectional view 140, cut along Y-Y of view 120. Cross-sectional view 170, cut along X-X of view 120, further shows that the floating gate 135 sharing the same word line 125 is electrically isolated by trenches 139 formed in P-substrate 138. Two floating gates are shown formed in view 140 on top of the P-Substrate 138 and below a respective word line 135. Each of these floating gates traditionally contain an intermediate oxide-nitride-oxide formed between a first and second layer of polysilicon. Silicon dioxide ($SiO_2$), is primarily used for the oxide layers, and silicon nitride (SiN) for the nitride layer.

Prior art manufacturing processes employ a chemical vapor deposition (CVD) process to form the first polysilicon layer, followed by additional CVD processes to form the oxide, nitride and oxide layers. The $SiO_2$ and SiN are deposited using different CVD tools, adding to the cost and time it takes to form the prior art flash memory of FIG. 1.

In the current process of making the NAND-flash shown in FIG. 1, thermally-oxidized silicon (Si) surface processing steps are performed, typically sequentially, leading to the formation of the two polysilicon layers, referred to as "Poly1" and "Poly2" with an inter-poly oxide-nitride-oxide (ONO) layer. The Poly1 layer is formed first, and is generally referred to as the floating gate. The Poly2 layer is generally referred to as the control gate. The ONO layer is formed between Poly1 and Poly2. The ONO layer includes a first oxide layer, formed on top of the Poly1 layer, a nitride layer formed on top of the first oxide layer, and a second oxide layer formed on top of the nitride layer. The Poly2 is formed on top of the second oxide layer. Thus, a chemical vapor deposition (CVD) process is used to make polysilicon, followed by additional CVD processes to make the first oxide, nitride, and second oxide layers comprising the ONO layer.

As scalability has been exploited, thereby increasing memory density, the floating gate has been reduced in size or dimensions. As the floating gate 135 becomes smaller, it becomes more difficult to balance charge retention with memory read/write speed. The shrinking dimensions of the floating gate 135 have or will soon reach their limitations, resulting in a density plateau for future flash memory products.

Accordingly, what is needed is a floating gate replacement for a nonvolatile semiconductor memory device where the floating gate replacement is capable of scaling beyond the limits of a traditional floating gate, thus increasing the density, capacity, and speed of the nonvolatile semiconductor memory device.

SUMMARY OF THE INVENTION

Briefly an embodiment of the present invention includes a non-volatile storage unit comprising a first and second N-diffusion well separated by a distance of P-substrate. A first isolation layer is formed upon the first and second N-diffusion wells and the P-substrate. A nano-pillar charge trap layer is formed upon the first isolation layer and includes conductive nano-pillars interspersed between non-conducting regions. The storage unit further includes a second isolation layer formed upon the nano-pillar charge trap layer; and at least one word line formed upon the second isolation layer and above a region of nano-pillar charge trap layer. The nano-pillar charge trap layer is operative to trap charge upon application of a threshold voltage. Subsequently, the charge trap layer may be read to determine any charge stored in the non-volatile storage unit, where presence or absence of stored charge in the charge trap layer corresponds to a bit value.

DESCRIPTION OF THE PREFERRED EMBODIMENTS

In accordance with various embodiments of the present invention, memory arrays are shown to comprise a multiplicity of flash storage units, each storage unit having a region of nano-pillars that are used as charge traps. Flash storage units are merely examples of non-volatile memory that can incorporate the various embodiments of the present invention. That is, any non-volatile memory that traditionally uses a floating gate is a candidate for replacement with the storage units of the various embodiments of the present invention.

The use of the nano-pillar charge traps avoids scalability problems currently encountered with flash memory, while resulting in a simpler processing method which results in a more reliable flash memory. For simplicity, each of the storage units of the various embodiments shown and disclosed herein are generally referred to as storing, programming, operative for storing, or operative for programming, a bit. It is understood, and contemplated that the storage units disclosed herein may also operate in a manner whereby each storage unit stores more than just a single bit, or are multi-level cells (MLC).

In accordance with an embodiment of the present invention, the continuous charge trap of prior art techniques is replaced with discrete charge trap by using a nano-pillar charge trap layer in place of the floating gate of prior art flash storage units.

In the embodiments disclosed herein, a storage unit is contemplated to include at least two N-diffusion wells in a substrate, and a nano-pillar charge trap layer positioned between the two N-diffusion wells, the nano-pillar charge trap layer replacing the floating gate of storage units for trapping charges, and the nano-pillar charge trap layer being addressable by a word line. This configuration allows for scalability, avoids leakage of voltage, and increases reliability over prior art non-volatile memory.

A number of embodiments are disclosed and described herein, with different combinations of layers, and orientations of nano-pillar charge trap layers. In one embodiment, a graded layer is used to create a gradation in the trapping areas.

Figure 2:
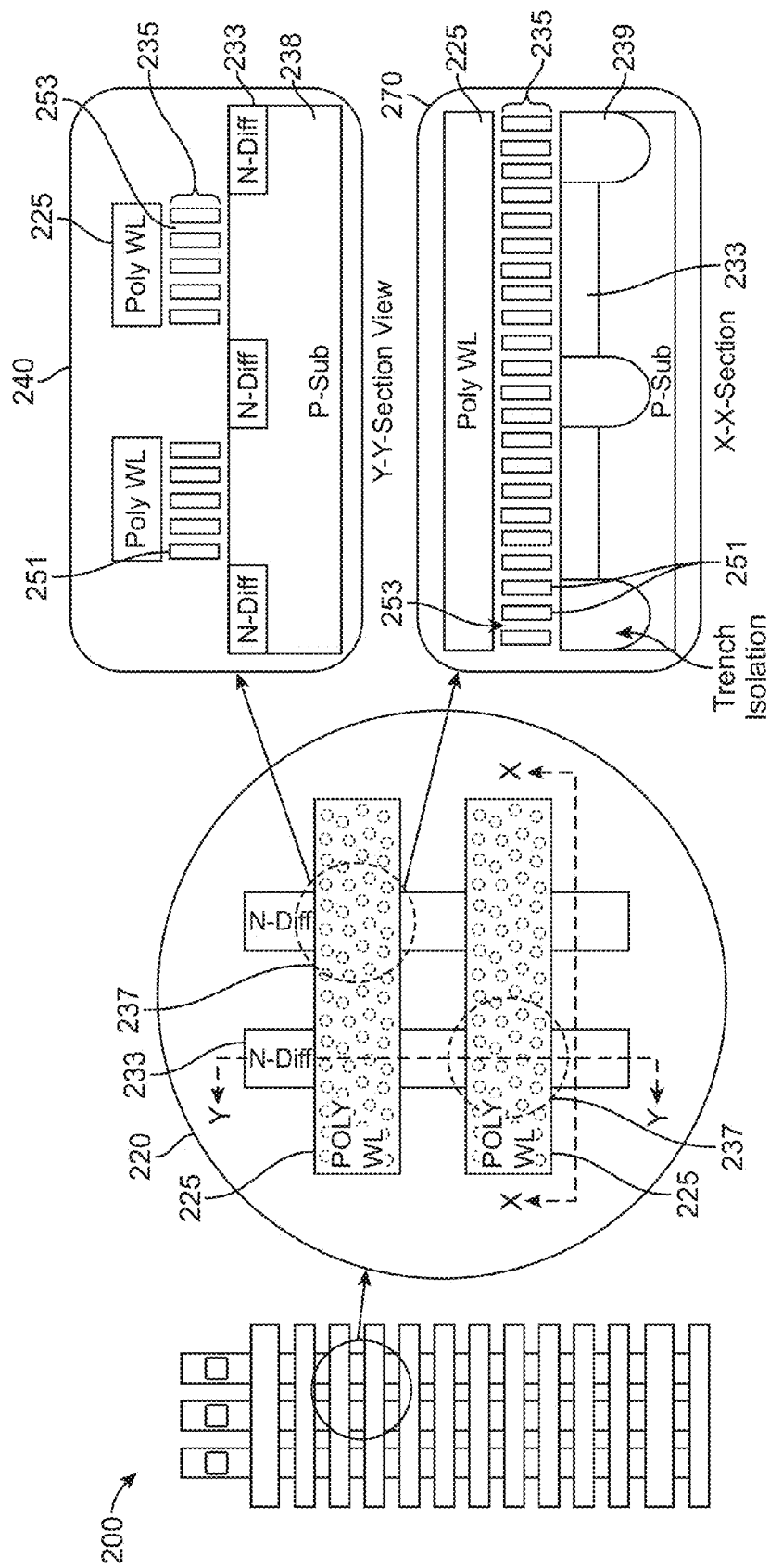
FIG. 2 shows a memory array having NAND-type flash storage units, in accordance with an embodiment of the present invention

Referring now to FIG. 2, memory array 200 is shown, in accordance with an embodiment of the present invention. Memory array 200 is shown to include a multiplicity of flash storage units 237. Flash storage units are examples of non-volatile memory. It is contemplated that the memory array 200 as well as all other memory arrays disclosed herein may be made of storage units other than flash but that they are non-volatile with a floating-gate-replacement layer.

View 220 of FIG. 2 shows a close-up view of four storage units 237 of the memory array 200. View 240 shows a cross-sectional view of two storage units 237 cut along Y-Y of view 220. View 270 shows a cross-sectional view of two storage units 237 cut along X-X of view 220.

Storage units 237 are, as are the other storage units disclosed herein, non-volatile resistive storage units. The storage units 237, in one embodiment of the present invention, are a NAND-type of flash storage unit, wherein the floating gate of a traditional NAND storage unit (e.g., floating gate 135 of storage unit 137 of FIG. 1) is substituted with a nano-pillar charge trap layer 235.

Memory array 200, analogous to other memory arrays shown and discussed herein, includes rows and columns of flash storage units, such as the storage units 237. These rows and columns of storage units are addressed or identified using bit lines and word lines where the activation of a particular bit line and a particular word line results in the identification of a particular storage unit.

Each storage unit 237 comprises two N-diffusion wells 233 formed in P-substrate 238. Each storage unit 237 further includes a nano-pillar charge trap layer 235 formed on top of the P-substrate 238, and positioned centrally between two N-diffusion wells 233. In a storage unit 237, nano-pillar charge trap layer 235 is not formed on top of or directly above any of N-diffusion wells 233, and is instead vertically offset from the N-diffusion wells 233. Word lines 225 are formed upon (or on top of) nano-pillar charge trap layers 235.

Two N-diffusion wells 233, the nano-pillar charge trap layer 235 and a word line 225 collectively comprise a transistor. Accordingly, view 240 shows two transistors as does view 270. However, in view 240, the two transistors share an N-diffusion well 233 (shown in between two other N-diffusion wells in view 240) whereas view 270 does not show the shared N-diffusion well of view 240.

In one embodiment of the present invention, each of the nano-pillars 251 has a diameter of 0.5-5 nano meters (nm). Each of the nano-pillars 251 is separated from another nano-pillar by a distance of non-conducting region 253, between 0.2-2 nm.

In one embodiment of the present invention, trenches 239 may be formed in the P-substrate 238, between the N-diffusion wells 233 of neighboring transistors, in order to electrically isolate each transistor from neighboring transistors. Trenches 239 may be made of materials, which are well-known to those skilled in the art. In alternative embodiments, an oxide layer is used in placement of the trenches 239.

In an alternative embodiment, the trenches 239 are replaced with an oxide layer. In other embodiments any suitable isolation layer may replace the trenches 239.

Nano-pillar charge trap layers 235 are made of a conducting material, nano-pillars 251, and a non-conducting material, non-conducting regions 253. In one embodiment of the present invention, the nano-pillars 251 are metallic, and the non-conducting regions 253 are non-metallic. Nano-pillars 251 are shown dispersed within non-conducting regions 253 in views 220, 240, and 270 of FIG. 2. Nano-pillars 251 may be generally cylindrical or spherical in shape.

The nano-pillars 251, formed under a word line 225, trap charge when voltage is applied to a storage unit 237 for programming thereof. During a read cycle, the charge trapped in nano-pillars 251 of storage unit 237 may modulate the gate voltage, thus allowing a storage unit 237 to store either a '0' or '1' bit value. The charge trapped in the nano-pillars 251 of nano-pillar charge trap layers 235 may be trapped on the surface of the nano-pillars 251. Consequently, it may be beneficial to form nano-pillars 251 with dimensions which provide maximum surface area for a given amount of deposition material.

Nano-pillars 251, in one embodiment of the present invention, are selected from the ferromagnetic materials such as alloys of Cobalt (Co), Iron (Fe), and Nickel (Ni), with any combination of additional metals selected from the transition metal group such as: Chromium (Cr), Tantalum (Ta), Titanium (Ti), Niobium (Nb), Molybdenum (Mo). In accordance with an embodiment of the present invention, non-conducting regions 253 may be comprised of oxides, nitrides, sulfides, or phosphides. For example, the oxide may be selected from one or more of oxides: silicon dioxide ($SiO_2$), titanium dioxide ($TiO_2$), tantalum penatoxide ($Ta_2O_5$), aluminum oxide ($Al_2O_3$), zirconium oxide ($ZrO_2$), hafnium oxide ($HfO_2$). Additionally, non-conducting regions 253 may also contain nitrides, oxy-nitrides, sulphides and phosphides of these.

Further, it may be advantageous for non-conducting regions 253 to comprise non-conducting ferro-magnetic materials chosen from: $SiO_2$, $TiO_2$, $Ta_2O_5$, $Nb_2O_5$, $ZrO_2$, $HfO_2$, TiN, TaN, $Cr_2O_3$. The use of ferro-magnetic materials for both nano-channels 251 and non-conducting regions 253 allows for a more robust manufacturing process with better process control, as the size, shape, and distributions of the magnetic trap particles forming nano-pillar charge trap layer 235 can be non-destructively controlled with quick feedback during the manufacturing process. For example, during the manufacturing process of memory array 200, process control may be done by measuring the magnetic properties of few or all wafers using an automatic kerr-looper, such as the automated wafer mapping system from Digital Measurements System of ADE technologies of Waltham, Mass., USA.

Non-magnetic materials may be used for forming nano-pillar charge trap layer 235, but in such cases process control may become challenging due to the inability to monitor real-time the formation of, and correct any formation problems regarding, the nano-pillar charge trap layer 235. Non-magnetic conductive metals suitable for use as nano-pillars 251 may include Chromium, Tantalum, Niobium, Titanium, Tungsten, Molybdenum, Rubidium, Platinum, and Palladium.

In accordance with an embodiment of the present invention, nano-pillar charge trap layer 235 may be Cobalt-X, with X being an element of one or many of transition elements, such as chrome, tantalum, titanium or other metallic elements, such as copper or silver. As a specific example, nano-pillar charge trap layer 235 may be Co—X-titanium dioxide ($TiO_2$) and is deposited on top of the tunnel oxide layer formed upon P-substrate 238 and N-diffusion wells 233, as discussed in more detail relative to FIGS. 9-13.

Preferably, nano-pillar charge trap layer 235 has a resistivity of over 500 ohms·cm, indicating that the particles are well isolated. This measurement is critical to ensuring an excellent trap. The size of nano-pillars 251 can be controlled by varying manufacturing processes, as well as by selecting specific ferromagnetic alloys. Ferromagnetic alloys, such as Co-based alloys, are likely to have smaller channel sizes. Preferably, the thickness of nano-pillar charge trap layer 235 is below 100 nanometers (nm). Thickness is used to mean the height of nano-pillar charge trap layer 235 from P-substrate 238 to word line 225. As an example, the nano-pillar charge trap layer 235 may be 10 nm thick and comprised of Co—$TiO_2$ with about 50 vol % of $TiO_2$, and the shape of the nano-pillars may be cylindrical with a diameter of about 5 nm.

Methods and processes for manufacturing storage units having nano-pillar charge trap layers are discussed in more detail below, in reference to FIGS. 14-18.

For more details regarding nano-pillar charge trap layer 235, the reader is referred to the discussion of nano-current-channels in U.S. patent application Ser. No. 11/674,124, filed on Feb. 12, 2007 by Ranjan et al. and entitled "NON-UNIFORM SWITCHING BASED NON-VOLATILE MAGNETIC BASED MEMORY," and U.S. patent application Ser. No. 11/932,940, filed on Oct. 31, 2007, by Wang and entitled "CURRENT-CONFINED EFFECT OF MAGNETIC NANO-CURRENT-CHANNEL (NCC) FOR MAGNETIC RANDOM ACCESS MEMORY (MRAM)," the disclosures of both U.S Patent Applications are incorporated herein by reference, as though set forth in full.

The storage unit 237 of FIG. 2 is typically used for storing digital information for any application requiring such storage. Similarly all storage units of the various other embodiments of the present invention, such as shown in FIGS. 3-13 are also used for storing digital information.

Figure 3:
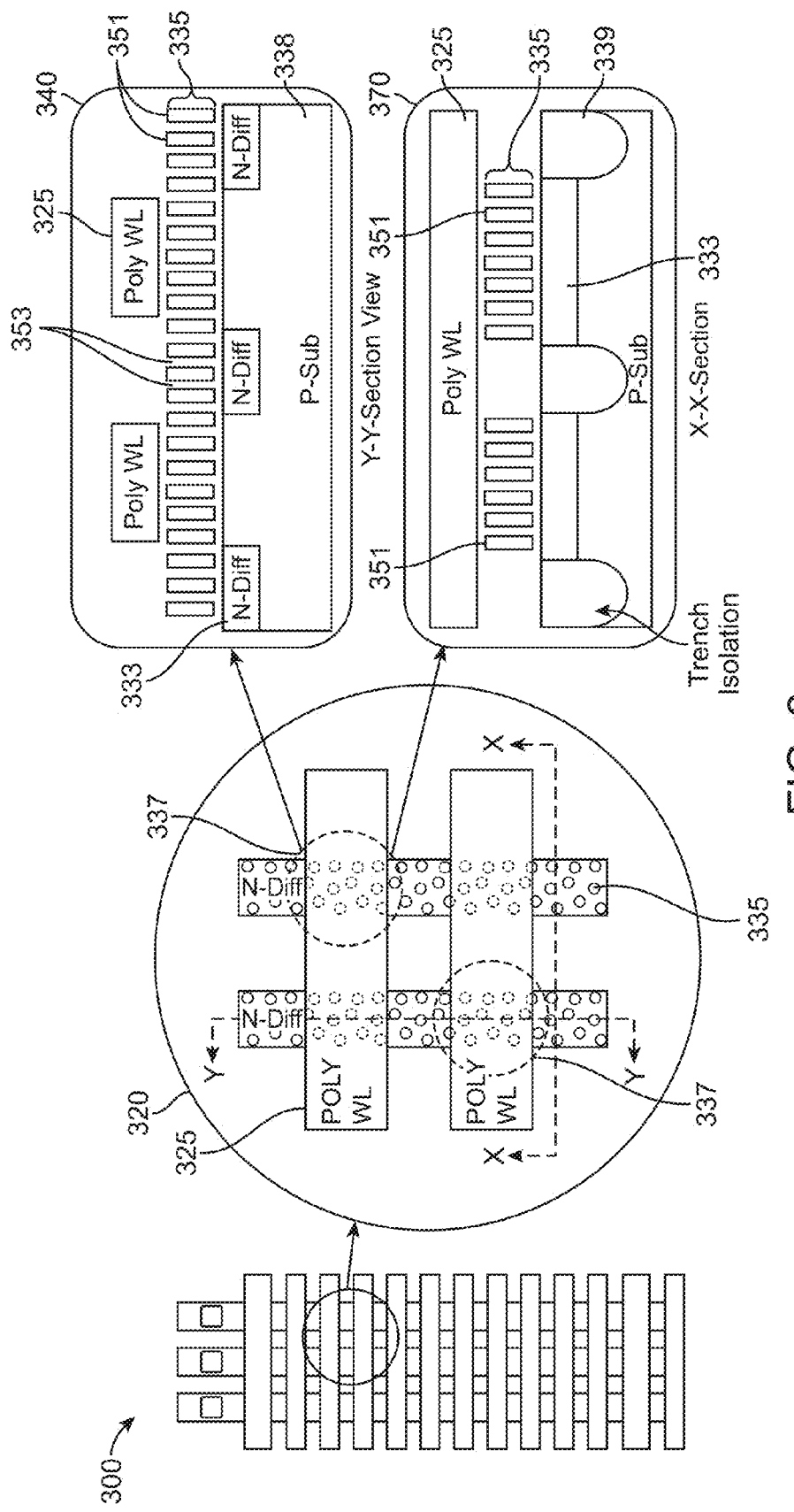
FIG. 3 shows a memory array having NAND-type flash storage units, in accordance with an alternative embodiment of the present invention

Referring now to FIG. 3, memory array 300 is shown, in accordance with another embodiment of the present invention. Memory array 300 is shown to include a multiplicity of storage units 337. View 320 of FIG. 3 shows a close-up view of the four storage units 337. View 340 shows a cross-sectional view of two storage units 337 cut along Y-Y of view 320. View 370 shows a cross-sectional view of two storage units 337 cut along X-X of view 320.

Flash storage units 337 are a NAND-type of flash storage unit, wherein the floating gate is substituted with a nano-pillar charge trap layer 335. Each storage unit 337 comprises two N-diffusion wells 333 formed in P-substrate 338, a nano-pillar charge trap layer 335 formed above P-substrate 238, and the nano-pillar charge trap layer 335 addressable by a word line 325.

In flash storage units 337, the nano-pillar charge trap layer 335 is formed in a direction perpendicular to the word lines 325, and upon/along the each column of N-diffusion wells 333. In a storage unit 337, nano-pillar charge trap layer 335 is formed on top of or directly above the N-diffusion wells 333, and not vertically offset from the N-diffusion wells 333, as are storage units 237 relative to N-diffusion wells 233. Word lines 325 are formed in a direction perpendicular to, and on top of nano-pillar charge trap layers 335. Trenches 339 may be formed in P-substrate 338, between the N-diffusion wells 333 of neighboring transistors, in order to electrically isolate each transistor from neighboring transistors. Trenches 339 may be made of dopents, which are well-known to those skilled in the art.

Nano-pillar charge trap layers 335 is comprised of conducting nano-pillars 351, which may be, for example, metallic, and non-conducting regions 353, which are non-conducting and non-metallic. Nano-pillars 351 are shown interspersed between non-conducting regions 353 in views 320, 340, and 370 of FIG. 3. Nano-pillars 351 may be generally cylindrical in shape. Nano-pillars 351 of nano-pillar charge trap layers 335 are analogous to the nano-pillars 251 of nano-pillar charge trap layers 235, respectively, of FIG. 2, in composition and dimensions. Non-conducting regions 353 of nano-pillar charge trap layers 335 are analogous to the non-conducting regions 253 of nano-pillar charge trap layers 235, respectively, of FIG. 2, in composition and dimensions.

Figure 1:
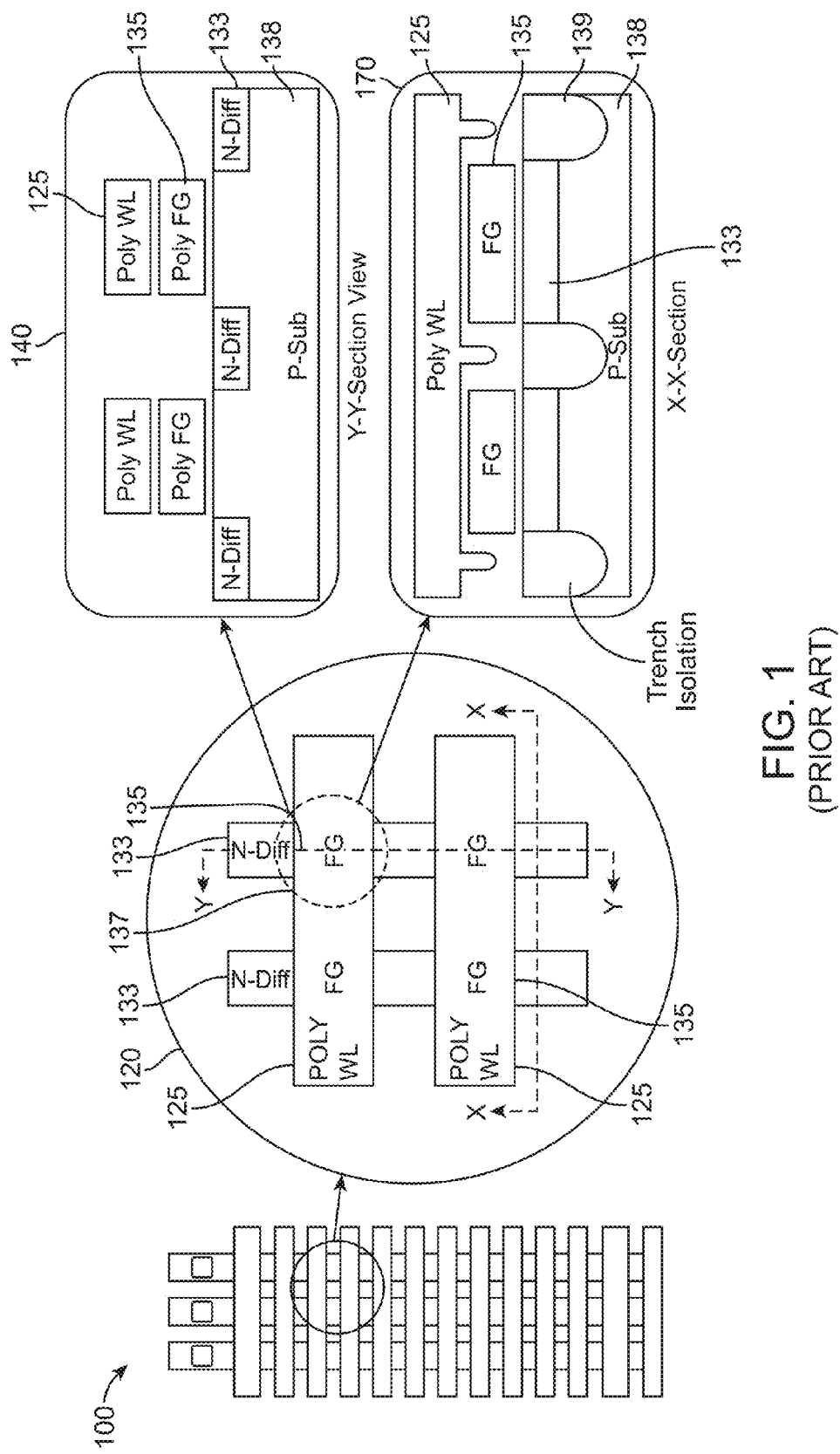
FIG. 1 shows prior art NAND-type flash storage units wherein floating gates store a charge to toggle the states of the storage units.

In prior art non-volatile storage units, such as storage units 137 of FIG. 1, the floating gate 135 must not be formed upon the N-diffusion wells 133, otherwise the floating gate 135 would fail to be electrically isolated, and would drain to the N-diffusion wells 133 instead of storing charge. The use of nano-pillar charge trap layer 335 as a replacement for a floating gate, as in the various embodiments of the present invention, however, does not necessitate such care, as nano-pillars 351 are electrically isolated from neighboring nano-pillars 351 by non-conducting regions 353. The application of current from word line 325 to nano-pillar charge trap layer 335 results in those nano-pillars 351 which are formed under word line 325, and are isolated from N-diffusion wells 333, each storing charge. Each nano-pillar 351 is its own discrete and electrically isolated element, thus the grounding or drainage of a single nano-pillar 351 does not necessarily result in the neighboring nano-pillars 351 also draining.

Comparing storage units 237 of memory array 200 and storage units 337 of memory array 300, the only difference is the orientation of the nano-pillar charge trap layers 235 and 335. Nano-pillar charge trap layer 235 and nano-pillar charge trap layer 335 are expected to perform identically under most circumstances, and may be used interchangeably. Consequently, orientation of the nano-pillar charge trap layers of a memory element may be selected based solely upon manufacturing efficiency or cost, and not the effect upon performance of the final product. This is further illustrated, and taken one step further, in memory array 400 of FIG. 4.

Figure 4:
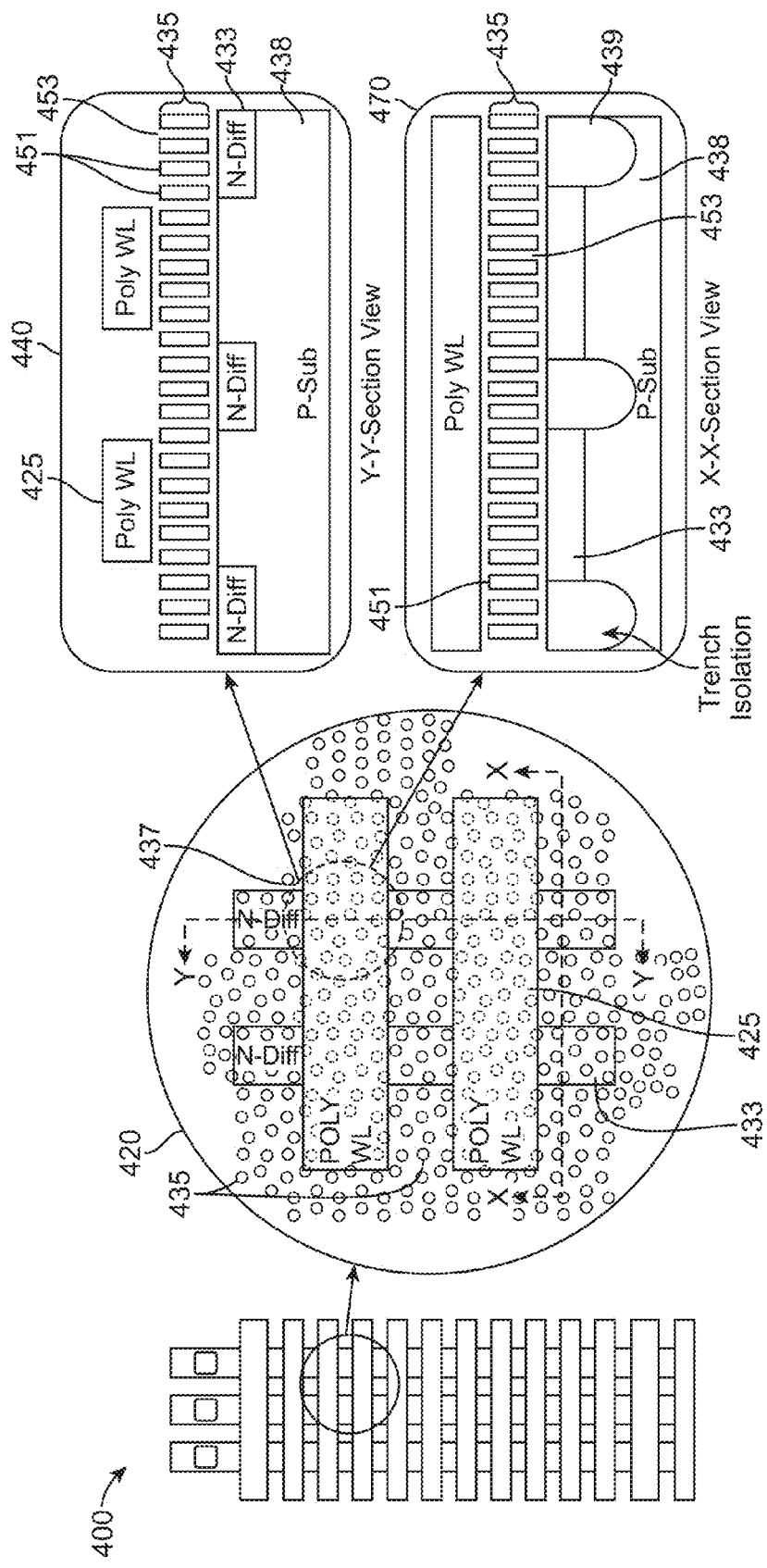
FIG. 4 shows a memory array having NAND-type flash storage units, in accordance with yet another embodiment of the present invention.

Referring now to FIG. 4, memory array 400 is shown, in accordance with an embodiment of the present invention. Memory array 400 is shown to include a multiplicity of storage units 437. View 420 of FIG. 4 shows a close-up view of the storage units 437. View 440 shows a cross-sectional view of storage units 437, cut along Y-Y of view 420. View 470 shows a cross-sectional view of storage units 437, cut along X-X of view 420.

Each storage unit 437 comprises two N-diffusion wells 433 formed in P-substrate 438. Each storage unit 437 further comprises a nano-pillar charge trap layer 435 formed upon P-substrate 438 and N-diffusion wells 433, and upon the nano-pillar charge trap layer 435, word line 425 is formed oriented in a direction perpendicular to the column of N-diffusion wells 433.

Word lines 425 are formed on top of nano-pillar charge trap layer 435. Trenches 439 may be formed in P-substrate 438, between the N-diffusion wells 433 of neighboring transistors, in order to electrically isolate each transistor from neighboring transistors. Trenches 439 may be made of dopents, which are well-known to those skilled in the art.

In flash storage units 437, the nano-pillar charge trap layer 435 is formed upon the entire surface P-Substrate 438, without regard for precise placement along either the columns of N-diffusion wells 433 (as shown in reference to memory element 300 in FIG. 3), or for tight overlap/coupling by word line 425 subsequently deposited upon nano-pillar charge trap layer 435 (as shown in reference to memory element 200 in FIG. 2). Unlike memory array 200 and 300 which have multiple nano-pillar charge trap layers formed in parallel with each other, the nano-pillar charge trap layer 435 of memory array 400 is one contiguous layer. Even though nano-pillar charge trap layer 435 is one contiguous layer, because the individual nano-pillars 451 are discrete conductive elements, electrically isolated from neighboring nano-pillars 451 by non-conducting regions 453, nano-pillars 451 may store charge, and thus a bit value, with the same integrity as the embodiments found in memory arrays 200 and 300.

Nano-pillar charge trap layer 435 are comprised of conducting nano-pillars 451, which may be, for example, metallic, and non-conducting regions 453, which are non-conducting and non-metallic. Nano-pillars 451 are shown dispersed within non-conducting regions 453 in views 420, 440, and 470 of FIG. 4. Nano-pillars 451 may be generally cylindrical in shape. Nano-pillars 451 of nano-pillar charge trap layer 435, of FIG. 4, may be identical to the nano-pillars 251 of nano-pillar charge trap layers 235, of FIG. 2, in composition and dimensions. That is, nano-pillars 451 are conductive, may be magnetic, and are generally cylindrical in shape, extending from P-substrate 438 to word line 425. Non-conducting regions 453 of nano-pillar charge trap layer 435 may comprise the same materials used to create non-conducting regions 253 of nano-pillar charge trap layer 235 of FIG. 2.

Figure 5:
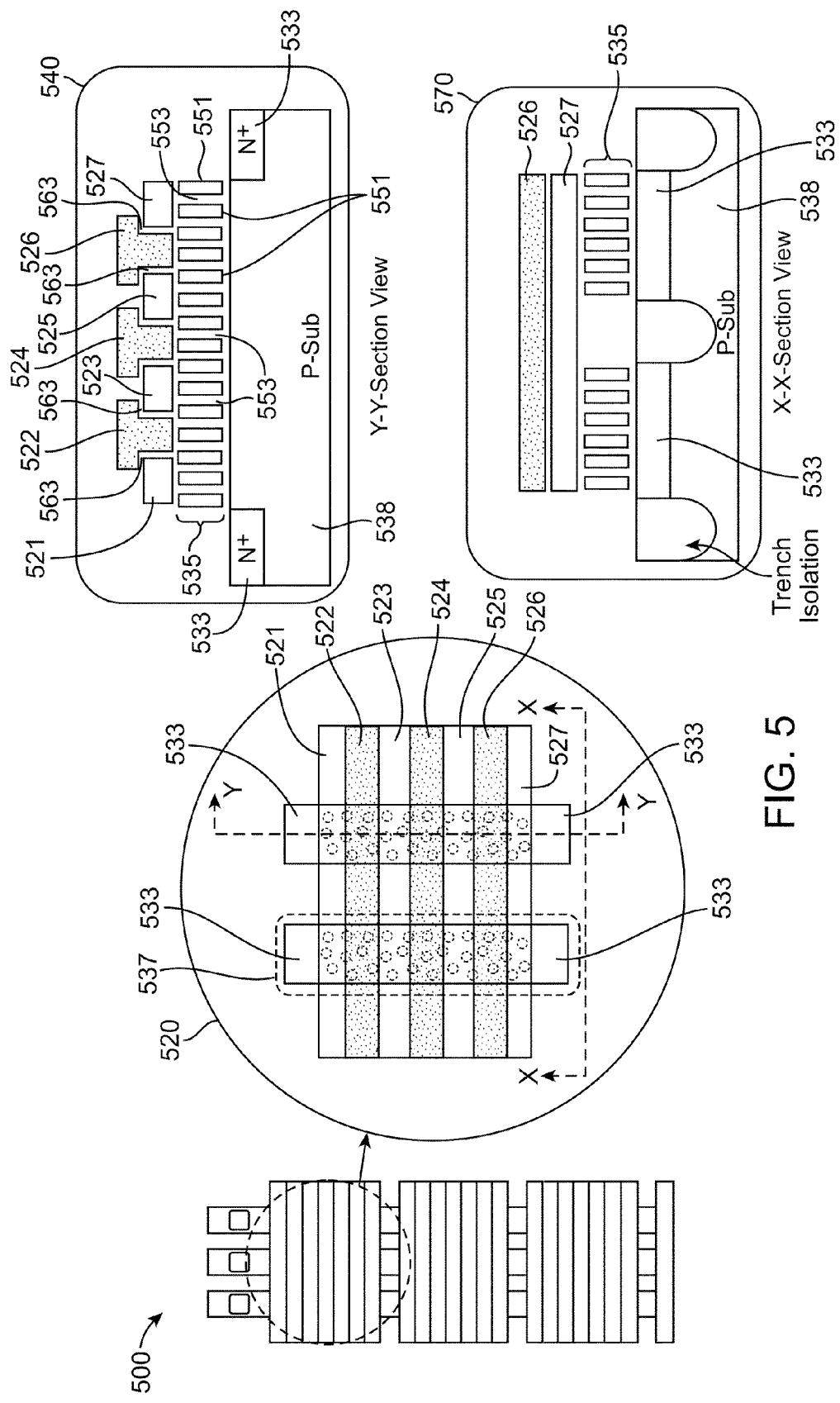
FIG. 5 shows a memory array having NAND-type flash storage units, in accordance with another embodiment of the present invention.

Referring now to FIG. 5, memory array 500 is shown, in accordance with another embodiment of the present invention. View 520 of FIG. 5 shows a close-up view of one of the multiplicity of multi-level storage units 537 of the memory array 500. View 540 shows a cross-sectional view of a storage unit 537, cut along Y-Y of view 520. View 570 shows a cross-sectional view of storage units 537, cut along X-X of view 520. A storage unit 537 is a multi-level storage or memory unit, wherein each storage unit 537 is adapted for storing multiple bits, further evidencing how a nano-pillar charge trap layer may increase the storage density of a storage (or memory) unit over prior art floating gate transistors.

A storage unit 537 is shown to include two N-diffusion wells 533 formed in P-substrate 538, nano-pillar charge trap layer 535 formed between the two N-diffusion wells 533, and word lines 521-527 formed upon nano-pillar charge trap layer 535.

In flash storage units 537, the nano-pillar charge trap layers 535 are formed in a direction oriented perpendicular to word lines 521-527. Nano-pillar charge trap layers 535 are formed in a direction oriented upon/along each column of N-diffusion wells 533. In a storage unit 537, nano-pillar charge trap layer 535 may not be formed on top of or directly above the N-diffusion wells 533, and may be vertically offset from the N-diffusion wells 533 such that no portion of nano-pillar charge trap layer 535 is formed above an N-diffusion well 533. Word lines 521-527 are formed on top of nano-pillar charge trap layers 535. Word lines 521-527 may be formed in a direction oriented perpendicular the direction of nano-pillar charge trap layer 535 (as shown in view 520). Trenches 539 may be formed in P-substrate 538, between the N-diffusion wells 533 of neighboring transistors, in order to electrically isolate each transistor from neighboring transistors. Trenches 539 may be made of dopents, which are well-known to those skilled in the art.

Nano-pillar charge trap layers 535 are shown to comprise nano-pillars 551 interspersed between non-conducting regions 553. Nano-pillars 551 are comprised of a conducting material which may be, for example, metallic. Non-conducting regions 553 are comprised of a non-conducting material and may be non-metallic. Nano-pillars 551 and non-conducting regions 553 may be comprised of a ferromagnetic material in order to facilitate monitoring and control of the process steps in which nano-pillar charge trap layers 535 are formed, as discussed above relative to FIG. 2.

Nano-pillars 551 may be generally cylindrical in shape. Nano-pillars 551 of nano-pillar charge trap layers 535 may be identical to the nano-pillars 251 of nano-pillar charge trap layers 235, of FIG. 2, in composition and dimensions. Non-conducting regions 553 of nano-pillar charge trap layers 535 may be identical to the non-conducting regions 253 of nano-pillar charge trap layers 235, of FIG. 2, in composition and dimensions.

Storage unit 537 is an exemplary embodiment of how the density of flash memory may be significantly increased through the use of a nano-channel charge trap layer 535. Each of word lines 521-527 are capable of tunneling charge to the region of nano-channel charge trap layer 535 upon which the individual word line is formed. In other words, by passing write current to a selected word line 521-527 (e.g., word line 523), only the nano-channels 551 of nano-channel charge trap layer 535 located under the word line (e.g., word line 523) will be charged.

The nano-pillars 551 under a word line selected from word lines 521-527 may trap charge when voltage is applied to the selected word line of storage unit 537 for programming thereof. During a read cycle, the charge trapped in nano-pillars 551 under the previously selected word line modulates the gate voltage, thus allowing a storage unit 537 to store either a '0' or '1' bit value under each of word lines 521-527. In other words, application of current to word line 523, for example, may result in a charge stored in the nano-pillars 551 directly below word line 523. Because each of the nano-pillars 551 are discrete elements, charge does not leak horizontally across nano-pillar charge trap layer 535 to neighboring nano-pillars 551, for example, those nano-pillars 551 located under word lines 522 and 524. Subsequently, whether or not charge has been stored to the nano-pillars 551 under word line 523 may be determined by applying current, having voltage less than that necessary to store a charge in nano-pillars 551, to other word lines 521, 522, 524, 525, 526, and 527, and then passing current between N-diffusion wells 533 of storage units 537. These read/write/erase operations, and the circuitry necessary for performing such operations, are common use in the field of NAND flash memory, and generally known to those having reasonable skill in the art.

The charge trapped in the nano-pillars 251 of nano-pillar charge trap layers 235 may be trapped on the surface of the nano-pillars 251. Consequently, it may be beneficial to form nano-pillars 251 with dimensions which provide maximum surface area for a given amount of deposition material.

As shown in FIG. 5, a storage unit 537 comprises seven word lines (word lines 521-527) formed upon nano-pillar charge trap layer 535, formed upon P-substrate 538 and located between N-diffusion wells 533. Thus, a flash storage unit 537 may store seven bits of information whereas the storage units 237 of memory array 200, storage units 337 of memory array 300, and storage units 447 of memory array 400 may each store only one bit of information. Storage units may comprise more or less than seven word lines formed above nano-pillar charge trap layer 535, in accordance with alternative embodiments of the present invention. For example, a storage unit may include more than seven word lines formed upon a nano-pillar charge trap layer. As the number of word lines per transistor increases, the number of bits stored in each storage unit increases as well. A storage unit may include less than seven word lines formed upon the nano-pillar charge trap layer, and thus store less than seven bits per storage unit.

The manufacturing process for the multiple word lines 521-527 of memory array 500 may proceed in a variety of ways. The process may include the formation of a first word line which is then etched into multiple word lines. For example, word lines 521, 523, 525 and 527 may be formed as a single, unitary word line which is then etched with three channels to form four distinct word lines. Alternatively, word lines 521, 523, 525, and 527 may each be deposited upon nano-pillar charge trap layer 535 as separate word lines. An isolation layer 563 may then be formed upon word lines 521, 523, 525, and 527, as will be discussed better relative to FIGS. 9-13. Upon isolation layer 563, word lines 522, 524 and 526 are then formed. Word lines 522, 524, and 526 may be each deposited as separate word lines, or, alternatively, they may be deposited as a single contiguous polysilicon layer, which is then etched to create three discrete word lines 522, 524, and 526. Isolation layer 563 ensures that word lines 522, 524, and 526 do not short any of the word lines 521, 523, 525, and 527 upon which they are formed.

In the preceding discussion, i.e., relative to FIGS. 2-5, NAND-type flash memory has been the focus of discussion for the various embodiments of the present invention. However, use of the present invention's nano-pillar charge trap layer should not be construed as limited to NAND-type flash memory. The inventors contemplate use of a nano-pillar charge trap layer in any type of transistor which employs a floating gate. As an example, reference is made to FIGS. 6-8, wherein NOR-type flash memories, which traditionally use a floating gate for storing charge, have the floating gate replaced by a nano-pillar charge trap layer.

Figure 6:
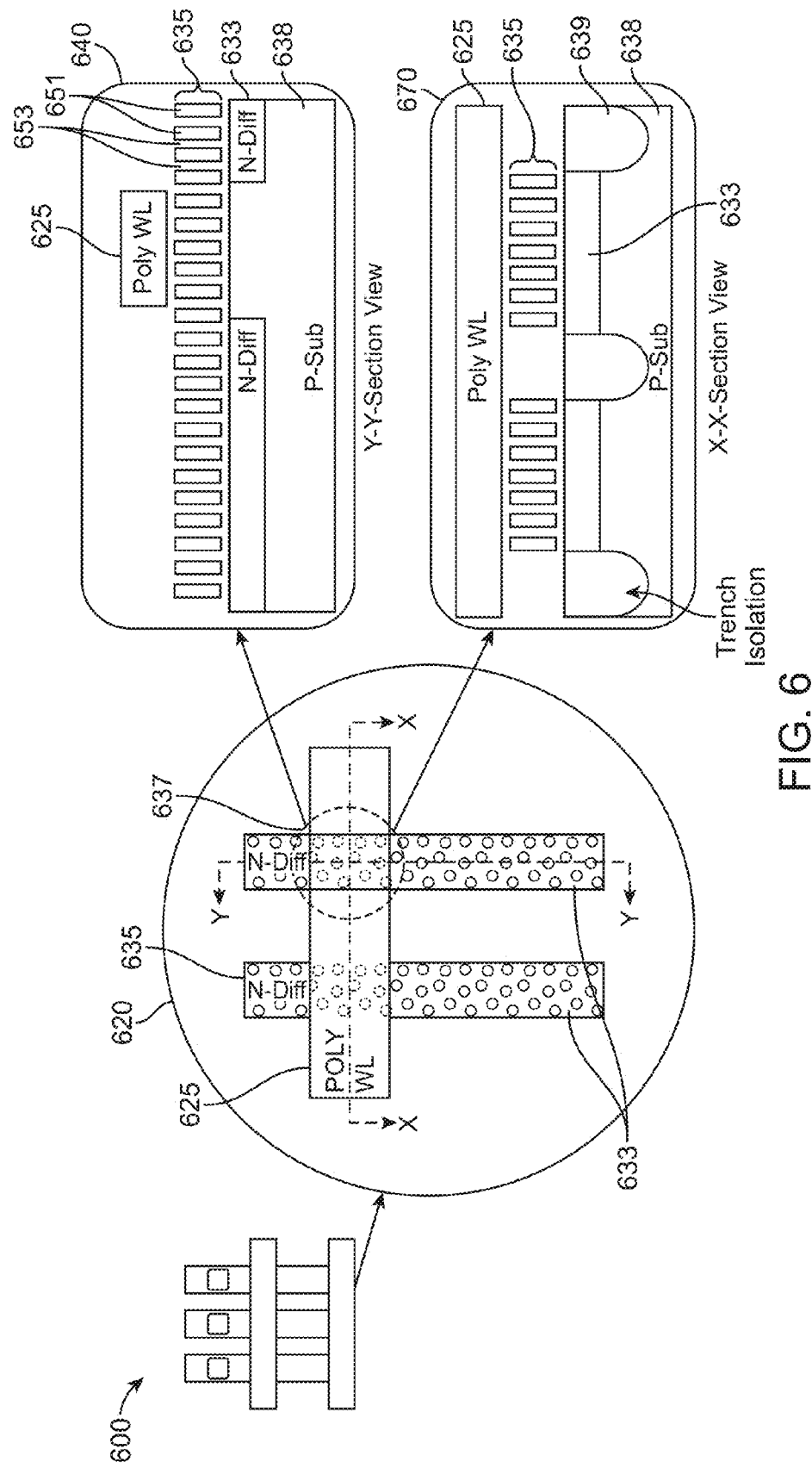
FIG. 6 shows NOR-type flash storage units, in accordance with an embodiment of the present.

Referring now to FIG. 6, memory array 600 is shown, in accordance with an embodiment of the present invention. Memory array 600 is shown to include a multiplicity of storage units 637. View 620 of FIG. 6 shows a close-up view of storage units 637. View 640 shows a cross-sectional view of storage units 637 cut along Y-Y of view 620. View 670 shows a cross-sectional view of storage units 637 cut along X-X of view 620. Memory array 600 is made of NOR type of flash memory. That is, each of the storage units 637 is a NOT type of flash or non-volatile memory.

In flash storage units 637, the nano-pillar charge trap layer 635 is formed substantially perpendicular to the word lines 625, and upon/along the each column of N-diffusion wells 633. In a storage unit 637, nano-pillar charge trap layer 635 is formed on top of or directly above the N-diffusion wells 633, and is not offset vertically from the N-diffusion wells 633. Word line 625 is formed on top of nano-pillar charge trap layers 635. Word line 625 may be formed in a direction oriented perpendicular to nano-pillar charge trap layers 635. Trenches 639 may be formed in P-substrate 638, between the N-diffusion wells 633 of neighboring transistors, in order to electrically isolate each transistor from neighboring transistors. Trenches 639 may be made of dopents, which are well-known to those skilled in the art.

Nano-pillar charge trap layers 635 are comprised of conducting nano-pillars 651, which may be, for example, metallic, and non-conducting regions 653, which are non-conducting and non-metallic. Nano-pillars 651 are shown dispersed within non-conducting regions 653 in views 620, 640, and 670 of FIG. 6. Nano-pillars 651 may be generally cylindrical in shape. Nano-pillars 651 of nano-pillar charge trap layers 635 may be identical to the nano-pillars 251 of nano-pillar charge trap layers 235, of FIG. 2, in composition and dimensions. Non-conducting regions 653 of nano-pillar charge trap layers 635 may be identical to the non-conducting regions 253 of nano-pillar charge trap layers 235, of FIG. 2, in composition and dimensions.

Figure 7:
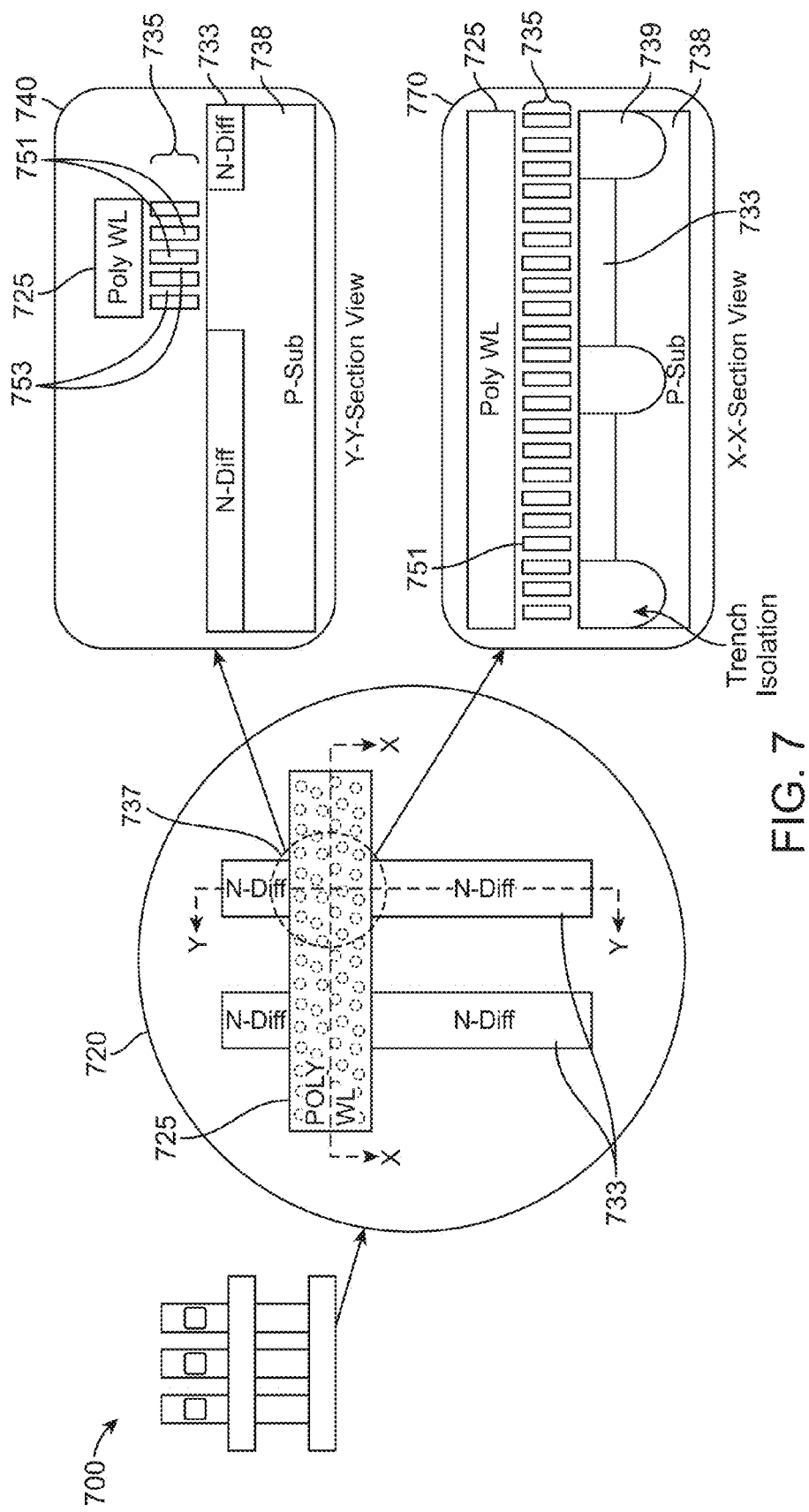
FIG. 7 shows NOR-type flash storage units, in accordance with another embodiment of the present invention.

Referring now to FIG. 7, flash memory array 700 is shown, in accordance with an embodiment of the present invention. Memory array 700 is shown to include a multiplicity of storage units 737. View 720 of FIG. 7 shows a close-up view of the storage units 737. View 740 shows a cross-sectional view of storage units 737 cut along Y-Y of view 720. View 770 shows a cross-sectional view of storage units 737 cut along X-X of view 720. Memory array 700 is a NOR type of flash memory.

As shown in FIG. 7, each storage unit 737 comprises two N-diffusion wells 733 formed in P-substrate 738. Each storage unit 737 further includes a nano-pillar charge trap layer 735 formed above P-substrate 738, and positioned centrally between the two N-diffusion wells 733. In a storage unit 737, nano-pillar charge trap layer 735 is not formed on top of or directly above any of N-diffusion wells 733, and is instead vertically offset from the N-diffusion wells 733 (as best shown in view 740). Word line 725 is formed upon nano-pillar charge trap layer 735. Trenches 739 may be formed in P-substrate 738, between the N-diffusion wells 733 of neighboring transistors, in order to electrically isolate each transistor from neighboring transistors. Trenches 739 may be made of dopents, which are well-known to those skilled in the art.

Nano-pillar charge trap layer 735 may be comprised of conducting nano-pillars 751, which may be, for example, metallic, and non-conducting regions 753, which are non-conducting and non-metallic. Nano-pillars 751 are shown dispersed within non-conducting regions 753 in views 720, 740, and 770 of FIG. 7. Nano-pillars 751 may be generally cylindrical in shape. Nano-pillars 751 of nano-pillar charge trap layer 735 may be identical to the nano-pillars 251 of nano-pillar charge trap layers 235, of FIG. 2, in composition and dimensions. Non-conducting regions 753 of nano-pillar charge trap layers 735 may be identical to the non-conducting regions 253 of nano-pillar charge trap layers 235, of FIG. 2, in composition and dimensions.

The use of a single nano-pillar charge trap layer 735, located under and formed prior to forming word line 725, may be preferable to the multiple nano-pillar charge trap layers 635 of memory array 600 for reducing manufacturing costs. As shown in FIG. 6, a nano-pillar charge trap layer 635 extends down the length of each column of N-diffusion wells 633. In view 620 specifically, two nano-pillar charge trap layers 635 are shown formed. Comparatively, only a single nano-pillar charge trap layer 735 is formed in memory array 700, where nano-pillar charge trap layer 735 extends below and along word line 725.

Comparing storage units 637 of memory array 600 and storage units 737 of memory array 700, the only difference between the memory arrays is the orientation of the nano-pillar charge trap layers 635 and 735. Nano-pillar charge trap layer 635 and nano-pillar charge trap layer 735 are expected to perform identically under most circumstances, and may be used interchangeably. Consequently, orientation of the nano-pillar charge trap layers of a memory array may be selected based solely upon manufacturing efficiency or cost, and not the effect upon performance of the final flash memory product. This is further illustrated, and taken one step further, in memory array 800 of FIG. 8.

Figure 8:
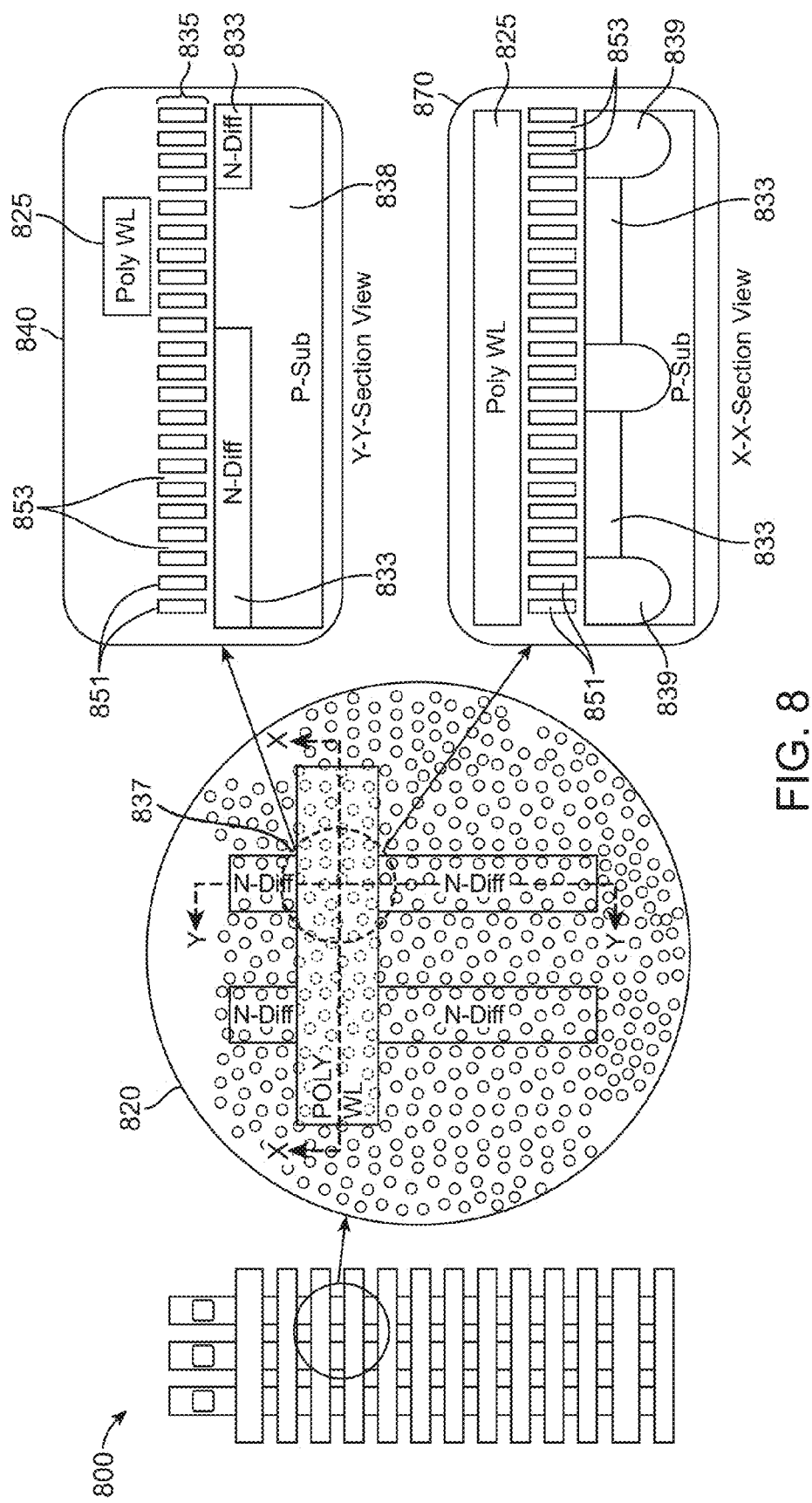
FIG. 8 shows a memory array having NOR-type flash storage units, in accordance with another embodiment of the present invention.

Referring now to FIG. 8, flash memory array 800 is shown, in accordance with an embodiment of the present invention. Memory array 800 is shown to include a multiplicity of storage units 837. View 820 of FIG. 8 shows a close-up view of the storage units 837. View 840 shows a cross-sectional view of storage units 837, cut along Y-Y of view 820. View 870 shows a cross-sectional view of storage units 837, cut along X-X of view 820. Memory array 800 is a NOR type of flash memory.

Each storage unit 837 comprises two N-diffusion wells 833 formed in P-substrate 838. Each storage unit 837 further comprises a nano-pillar charge trap layer 835 formed upon P-substrate 838 and N-diffusion wells 833; and upon the nano-pillar charge trap layer 835, word line 825 may be formed oriented perpendicular to the column of N-diffusion wells 433.

Word line 825 is formed on top of nano-pillar charge trap layer 835. Trenches 839 may be formed in P-substrate 838, between the N-diffusion wells 833 of neighboring transistors, in order to electrically isolate each transistor from neighboring transistors. Trenches 839 may be made of dopents, which are well-known to those skilled in the art.

In flash storage units 837, the nano-pillar charge trap layer 835 is formed upon the entire surface P-Substrate 838, without regard for precise placement along either the columns of N-diffusion wells 833 (as shown in reference to memory array 600 in FIG. 6), or for tight overlap/coupling to word line 825 which is subsequently deposited upon nano-pillar charge trap layer 835 (as shown in reference to memory array 700 in FIG. 7).

Nano-pillar charge trap layer 835 may be comprised of conducting nano-pillars 851, which may be, for example, metallic, and non-conducting regions 853, which are non-conducting and non-metallic. Nano-pillars 851 are shown dispersed within non-conducting regions 853 in views 820, 840, and 870 of FIG. 8. Nano-pillars 851 may be generally cylindrical in shape. Nano-pillars 851 of nano-pillar charge trap layer 835 may be identical to the nano-pillars 251 of nano-pillar charge trap layers 235, of FIG. 2, in composition and dimensions. That is, nano-pillars 851 are conductive, may be magnetic, and are generally cylindrical in shape, extending from P-substrate 838 to word line 825. Non-conducting regions 853 may be identical to non-conducting regions 253 of nano-pillar charge trap layers 235, of FIG. 2, in composition and dimensions.

Unlike memory array 600, which has multiple nano-pillar charge trap layers formed in parallel with each other, the nano-pillar charge trap layer 835 of memory array 800 is one contiguous layer. Even though nano-pillar charge trap layer 835 may be one contiguous layer, because the individual nano-pillars 851 are discrete conductive elements, electrically isolated from neighboring nano-pillars 851 by non-conducting regions 853, nano-pillars 851 may store charge, and thus a bit value, with the same integrity as the embodiments found in memory arrays 600 and 700.

Referring now to FIGS. 9-13, cross-sectional views of storage units 900, 1000, 1100, 1200, and 1300 are shown, in accordance with various embodiments of the present invention. The storage units of FIGS. 9-13 are shown in the attached figures, and discussed below, to facilitate understanding of the layers, and relationship between the layers, which may comprise a storage unit having the nano-pillar charge trap layer of the present invention.

Figure 9:
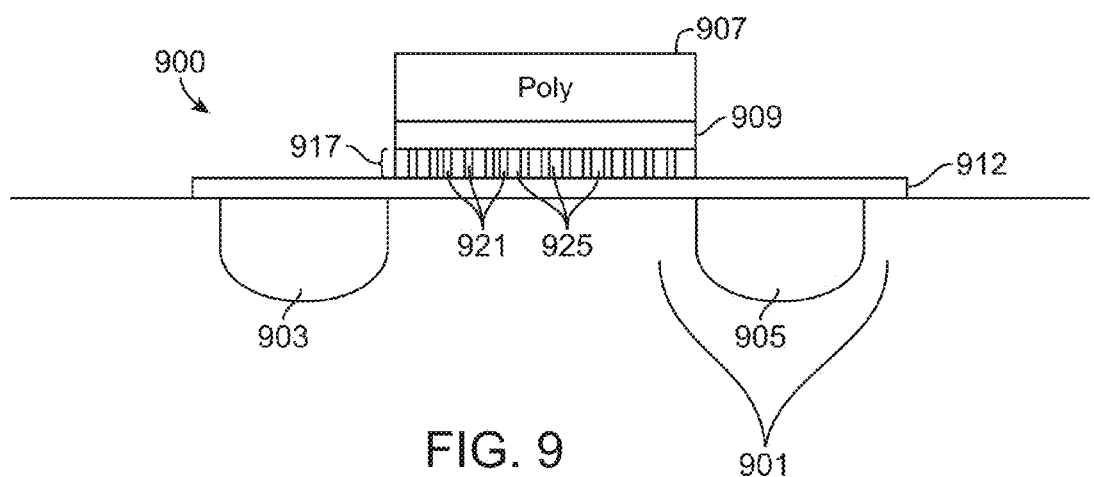
FIG. 9 shows a storage unit, in accordance with yet another embodiment of the present invention.

Referring to FIG. 9, flash storage unit 900 is shown in accordance with an embodiment of the present invention. In the storage unit 900, N-diffusion wells 903 and 905 are formed in a substrate 901. Formed upon substrate 901 and N-diffusion wells 903 and 905 is a first isolation layer 912. Formed upon first isolation layer 912 is nano-pillar charge trap layer 917. Nano-pillar charge trap layer 917 comprises nano-pillars 921 interspersed between non-conducting regions 925. Upon nano-pillar charge trap layer 917 is formed a second isolation layer 909, and upon the second isolation layer 909 is shown formed polysilicon word line 907.

N-diffusion wells 903 and 905 are substantially identical to the N-diffusion wells of memory arrays 200-800. Nano-pillar charge trap layer 917 is substantially identical to nano-pillar charge trap layer 235, discussed above relative to FIG. 2, and the nano-pillar charge trap layers of other memory arrays 300-800. Similarly, nano-pillars 921 are substantially identical to nano-pillars 251, and non-conducting regions 925 are substantially identical to non-conducting regions 253. Word line 907 is substantially identical to word line 225, discussed above relative to FIG. 2, as well as the word lines discussed above relative to memory arrays 300-800.

The first isolation layer 912 serves as an isolation layer between the nano-pillar charge trap layer 917 and substrate 901, and between nano-pillar charge trap layer 917 and N-diffusion wells 903 and 905. Generally, first isolation layer 912 may be either a layer of an oxide or nitride. Preferably, first isolation layer 912 is an oxide layer, and may be, for example, $TiO_2$. The materials used to form the first isolation layer 912 may be selected for ensuring better quality growth of nano-pillar charge trap layer 917 upon first isolation layer 912. That is, the use of select oxides in first isolation layer 912 may ensure more uniform growth and dispersion of the nano-pillars 921 within non-conducting regions 925 of the nano-pillar charge trap layer 917 formed upon first isolation layer 912. In accordance with an embodiment of the present invention, first isolation layer 912 may be, at most, 200 nm thick. Preferably, the first isolation layer 912 may be about 10 nm thick.

Nano-pillar charge trap layer 917 comprises nano-pillars 921 interspersed between non-conducting regions 925. Nano-pillars 921 are substantially the same as nano-pillars 251 of memory array 200 in both composition and dimensions. Nano-pillars 921 may be a metallic material, such as Cobalt-X, in accordance with an embodiment of the present invention. Non-conducting regions 925 are substantially the same as non-conducting regions 253 of memory array 200. Non-conducting regions 925 may be comprised of, for example, TiO2. Upon nano-pillar charge trap layer 917 is formed a second isolation layer, second isolation layer 909.

Second isolation layer 909 serves as an isolation layer between the nano-pillar charge trap layer 917 and polysilicon word line 907. Generally, second isolation layer 909 may be either a layer of an oxide or nitride. Second isolation layer 909 may be made of, for example, $TiO_2$. In a yet another embodiment, the layer 909 as well as the non-conducting region 925 is comprised of MgO. Together, first isolation layer 912 and second isolation layer 909 provide an electron barrier around nano-pillar charge trap layer 917. First isolation layer 912 and second isolation layer 909 ensure that charge, once stored in the nano-pillars 921 of nano-pillar trap charge layer 917, does not leak out to P-substrate 901, N-diffusion wells 903 or 905, word line 907, and otherwise prevents shorting of the storage unit 900.

In accordance with an embodiment of the present invention, storage units 900 may be formed by the following steps. First, trenches 903 and 905 are implanted in P-substrate 901. Then, first isolation layer 912 is deposited over P-substrate 901 and trenches 903 and 905. Next, nano-pillar charge trap layer 917 is then deposited upon first isolation layer 912. Second isolation layer 909 is then formed upon nano-pillar charge trap layer 917. Nano-pillar charge trap layer 917 and second isolation layer 909 are then etched, and word line 907 is formed upon second isolation layer 909. Word line 907 may subsequently be etched. In an embodiment of the present invention, advantageously, all the layers 907, 909 and 917 are all etched at the same time in one process step.

Figure 10:
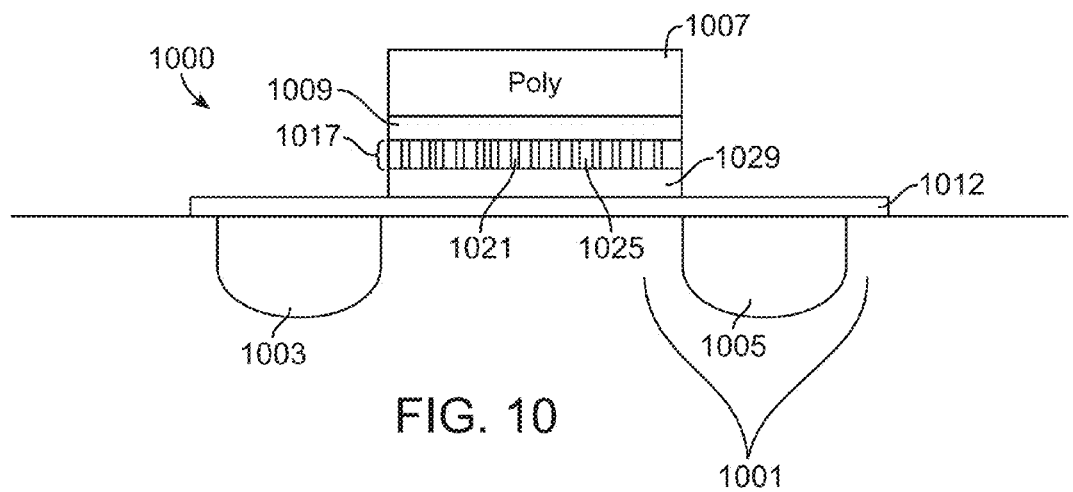
FIG. 10 shows a storage unit, in accordance with another embodiment of the present invention.

Referring now to FIG. 10, flash storage unit 1000 is shown in accordance with an embodiment of the present invention. In the storage unit 1000, N-diffusion wells 1003 and 1005 are formed in a substrate 1001. Formed upon substrate 1001 and N-diffusion wells 1003 and 1005 is a first isolation layer 1012. Formed upon first isolation layer 1012 is a second isolation layer 1029, and upon second isolation layer 1029 is formed nano-pillar charge trap layer 1017. Nano-pillar charge trap layer 1017 comprises nano-pillars 1021 interspersed between non-conducting regions 1025. Upon nano-pillar charge trap layer 1017 is formed a third isolation layer 1009, and upon the third isolation layer 1009 is shown formed polysilicon word line 1007.

N-diffusion wells 1003 and 1005 are substantially identical to the N-diffusion wells of memory arrays 200-800. Nano-pillar charge trap layer 1017 is substantially identical to nano-pillar charge trap layer 235, discussed above relative to FIG. 2, and the nano-pillar charge trap layers of other memory arrays 300-800. Similarly, nano-pillars 1021 are substantially identical to nano-pillars 251, and non-conducting regions 1025 are substantially identical to non-conducting regions 253. Word line 1007 is substantially identical to word line 225, discussed above relative to FIG. 2, as well as the word lines discussed above relative to memory arrays 300-800. First isolation layer 1012 is substantially identical to first isolation layer 912 of storage unit 900, and third isolation layer 1009 is substantially identical to second isolation layer 909 of storage unit 900.

The sole difference between storage unit 1000 and storage unit 900 is due to the addition of another isolation layer, second isolation layer 1029, in storage unit 1000. Second isolation layer 1029 may be either a layer of oxide or nitride. Preferably, second isolation layer 1029 is an oxide layer. Second isolation layer 1029 may serve to better isolate nano-pillar charge trap layer 1017 from P-substrate 1001 and N-diffusion wells 1003 and 1005. Further, second isolation layer 1029 may aid in growing superior microstructures within nano-pillar charge trap layer 1017.

Figure 11:
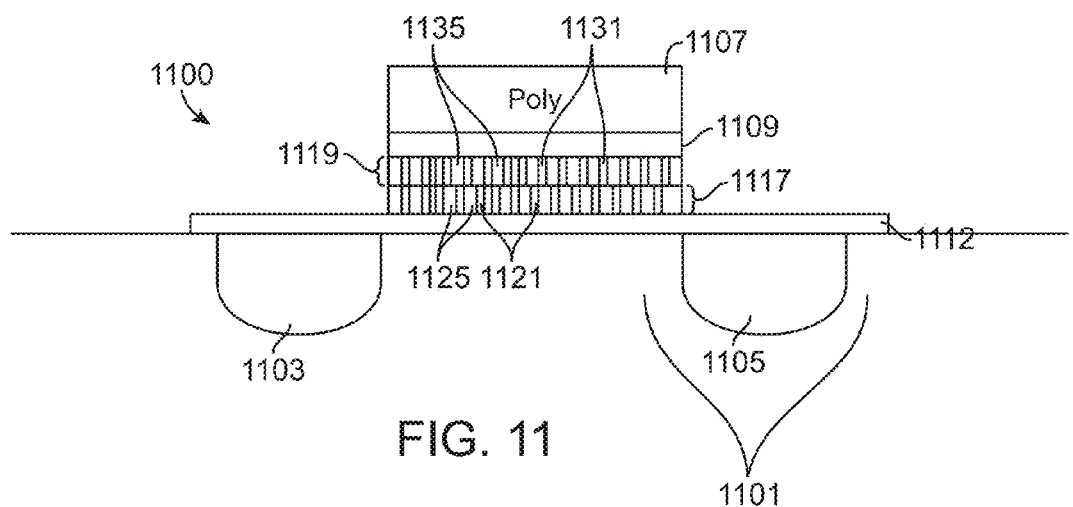
FIG. 11 shows a storage unit, in accordance with yet another embodiment of the present invention.

Referring now to FIG. 11, flash storage unit 1100 is shown in accordance with an embodiment of the present invention. In the storage unit 1100, N-diffusion wells 1103 and 1105 are formed in a substrate 1101. Formed upon substrate 1101 and N-diffusion wells 1103 and 1105 is a first isolation layer 1112. Formed upon first isolation layer 1112 is a first nano-pillar charge trap layer 1117, and upon first nano-pillar charge trap layer 1117 is formed second nano-pillar charge trap layer 1119. First nano-pillar charge trap layer 1117 comprises nano-pillars 1121 interspersed between non-conducting regions 1125. Second nano-pillar charge trap layer 1119 comprises nano-pillars 1131 interspersed between non-conducting regions 1135. Upon second nano-pillar charge trap layer 1119 is formed a second isolation layer 1109, and upon second isolation layer 1109 is shown formed polysilicon word line 1107.

N-diffusion wells 1103 and 1105 are substantially identical to the N-diffusion wells of memory arrays 200-800. First and second nano-pillar charge trap layers 1117 and 1119 are substantially identical to nano-pillar charge trap layer 235, discussed above relative to FIG. 2, and the nano-pillar charge trap layers of other memory arrays 300-800. Similarly, nano-pillars 1121 and 1131 are substantially identical to nano-pillars 251, and non-conducting regions 1125 and 1135 are substantially identical to non-conducting regions 253. Word line 1107 is substantially identical to word line 225, discussed above relative to FIG. 2, as well as the word lines discussed above relative to memory arrays 300-800. First isolation layer 1112 is substantially identical to first isolation layer 912 of storage unit 900, and second isolation layer 1109 is substantially identical to second isolation layer 909 of storage unit 900.

The sole difference between storage unit 1100 and storage unit 900 is due to the addition of a second nano-pillar charge trap layer, second nano-pillar charge trap layer 1119, between the first isolation layer and nano-pillar charge trap layer. That is, two nano-pillar charge trap layers are found in storage unit 1100. Multiple layers of nano-pillar charge trap layers may be used to further increase the trapping efficiency of storage unit 1100. A storage unit having multiple nano-pillar charge trap layers may be better suited for multi-state designs, such as multi-level storage units which store 2 or more bits. Storage of greater than 2 bits per storage unit, such as, for example, 3 or 4 bits per storage unit, may be further recognized by using graded nano-pillars in the nano-pillar charge trap layers, as discussed below, relative to FIGS. 12 and 13.

Figure 12:
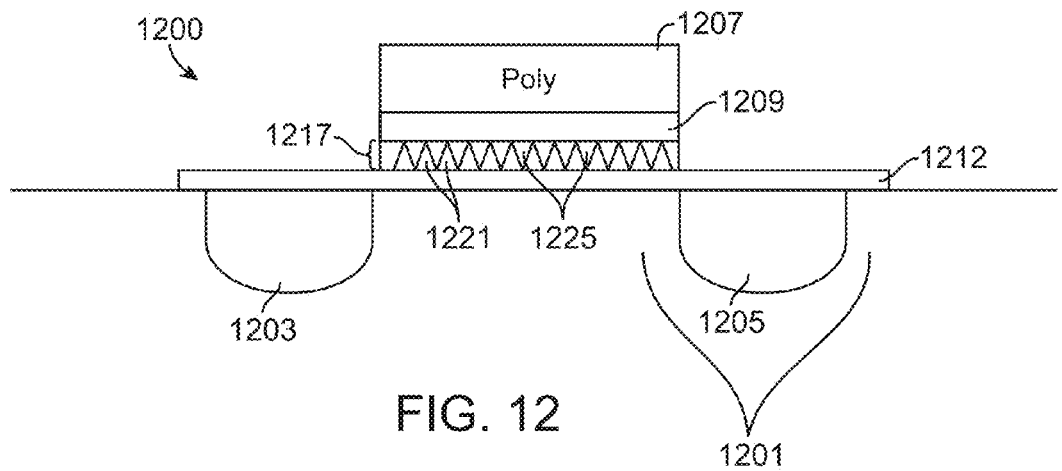
FIG. 12 shows a storage unit, in accordance with yet another embodiment of the present invention.

Referring now to FIG. 12 storage unit 1200 is shown with a graded nano-pillar charge trap layer 1217, in accordance with an alternative embodiment of the present invention. In the storage unit 1200, N-diffusion wells 1203 and 1205 are formed in a substrate 1201. Formed upon substrate 1201 and N-diffusion wells 1203 and 1205 is a first isolation layer 1212. Formed upon first isolation layer 1212 is a graded nano-pillar charge trap layer 1217. Graded nano-pillar charge trap layer 1217 comprises nano-pillars 1221 interspersed between non-conducting regions 1225. Upon graded nano-pillar charge trap layer 1217 is formed a second isolation layer 1209, and upon second isolation layer 1209 is shown formed polysilicon word line 1207.

N-diffusion wells 1203 and 1205 are substantially identical to the N-diffusion wells of memory arrays 200-800. Word line 1207 is substantially identical to word line 225, discussed above relative to FIG. 2, as well as the word lines discussed above relative to memory arrays 300-800.

Graded nano-pillar charge trap layer 1217 is graded. Some benefits of and methods for forming a graded nano-pillar charge trap layer 1217 are discussed in U.S. patent application Ser. No. 11/776,692, filed on Jul. 12, 2007, by Ranjan et al., and entitled "NON-VOLATILE MAGNETIC MEMORY ELEMENT WITH GRADED LAYER", which is incorporated herein by reference as though set forth in full. A graded nano-pillar charge trap layer 1217 may improve electron tunneling through the layer, as well as charge storage. Graded nano-pillar charge trap layer 1217 comprises nano-pillars 1221 interspersed between non-conducting regions 1225. Nano-pillars 1221 may be a metallic material, such as Cobalt-X, in accordance with an embodiment of the present invention. Non-conducting regions 1225 may be substantially the same material as non-conducting regions 253 of memory array 200. Non-conducting regions 1225 may be comprised of, for example, TiO2. Non-conducting regions 1225 may be substantially the same material as non-conducting regions 253 of memory array 200. Non-conducting regions 1225 may be comprised of, for example, TiO2, SiO2 or MgO. Upon nano-pillar charge trap layer 917 is formed a second isolation layer, second isolation layer 909.

The first isolation layer 1212 serves as an isolation layer between the graded nano-pillar charge trap layer 1217 and substrate 1201, and between graded nano-pillar charge trap layer 1217 and N-diffusion wells 1203 and 1205. Generally, first isolation layer 1212 may be either a layer of an oxide or nitride. Preferably, first isolation layer 1212 is an oxide layer, and may be, for example, $TiO_2$. The materials used to form the first isolation layer 1212 may be selected for ensuring better quality growth of graded nano-pillar charge trap layer 1217 upon first isolation layer 1212. That is, the use of select oxides in first isolation layer 1212 may ensure more uniform growth and dispersion of the nano-pillars 1221 within non-conducting regions 1225 of the graded nano-pillar charge trap layer 1217 formed upon first isolation layer 1212. In accordance with an embodiment of the present invention, first isolation layer 1212 may be, at most, 200 nm thick. Preferably, the first isolation layer 912 may be about 10 nm thick.

Figure 13:
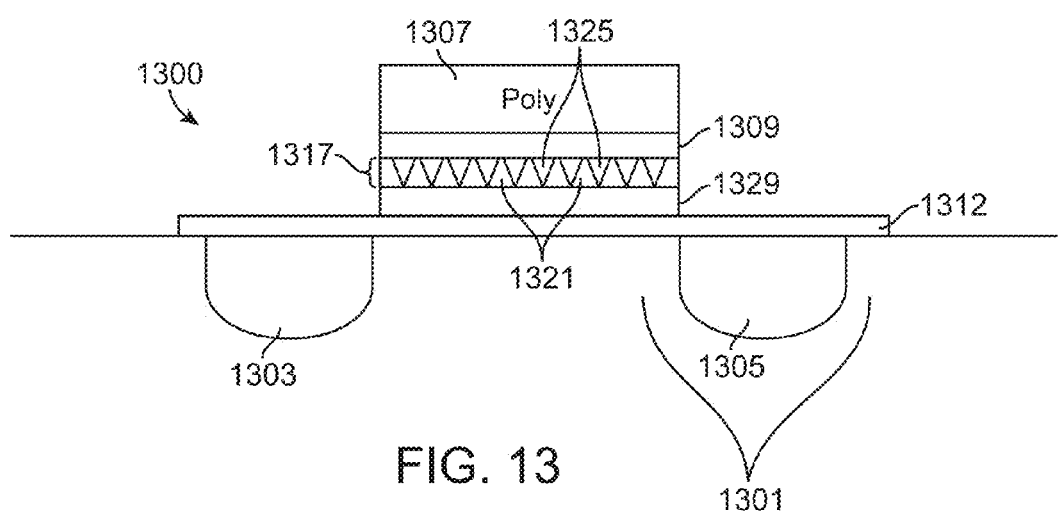
FIG. 13 shows a storage unit, in accordance with another embodiment of the present invention.

Referring now to FIG. 13 storage unit 1300 is shown having a graded nano-pillar charge trap layer 1317, in accordance with yet another embodiment of the present invention.

In a storage unit 1300, N-diffusion wells 1303 and 1305 are formed in a substrate 1301. Formed upon substrate 1301 and N-diffusion wells 1303 and 1305 is a first isolation layer 1312. Formed upon first isolation layer 1312 is a second isolation layer 1329, and upon second isolation layer 1329 is formed graded nano-pillar charge trap layer 1317. Graded nano-pillar charge trap layer 1317 comprises graded nano-pillars 1321 interspersed between non-conducting regions 1325. Upon graded nano-pillar charge trap layer 1317 is formed a third isolation layer 1309, and upon the third isolation layer 1309 is shown formed polysilicon word line 1307.

N-diffusion wells 1303 and 1305 are substantially identical to the N-diffusion wells of memory arrays 200-800. Graded nano-pillar charge trap layer 1317 is substantially identical to graded nano-pillar charge trap layer 1217, discussed above relative to FIG. 12. Word line 1307 is substantially identical to word line 225, discussed above relative to FIG. 2, as well as the word lines discussed above relative to memory arrays 300-800. First isolation layer 1312 is substantially identical to first isolation layer 1212 of storage unit 1200, and third isolation layer 1309 is substantially identical to second isolation layer 1209 of storage unit 1200.

The sole difference between storage unit 1300 and storage unit 1200 is due to the addition of another isolation layer, second isolation layer 1329, in storage unit 1300. Second isolation layer 1329 may be either a layer of oxide or nitride. Preferably, second isolation layer 1329 is an oxide layer. Second isolation layer 1329 may serve to better isolate graded nano-pillar charge trap layer 1317 from P-substrate 1301 and N-diffusion wells 1303 and 1305. Further, second isolation layer 1329 may aid in growing superior graded microstructures within graded nano-pillar charge trap layer 1317. That is, the material selected for comprising first isolation layer 1312 may be selected for its superior electrically isolative properties, while the material selected for comprising second isolation layer 1329 may be selected for its tendency to grow superior graded nano-pillars 1321 of graded nano-pillar charge trap layer 1317.

Figure 14:
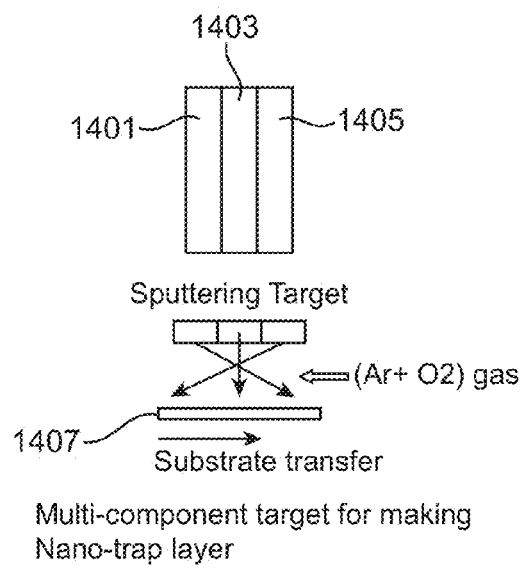
FIG. 14 shows a first structure for performing the simultaneous sputtering of multiple components and thereby forming a nano-pillar charge trap layer are shown, in accordance with an embodiment of the present invention.

Referring now to FIG. 14, a first structure for performing the simultaneous sputtering of multiple components and thereby forming a nano-pillar charge trap layer are shown, in accordance with an embodiment of the present invention. Sputtering targets 1401-1405 may be sputtered in the presence of Ar+O2 gas, as substrate 1407 is planed at a chosen velocity. The nano-pillar charge trap layer formed on the wafer is a composite nano-pillar charge trap film where the composition of the trap to the surrounding non-conducting areas can be varied by changing the ratios or the size of the individual portions of the targets 1401-1405.

In accordance with one embodiment of the present invention, targets 1401-1405 are Cobalt, Cobalt-$TiO_2$, and $TiO_2$, respectively. This leads to a graded film structure like the one shown in the FIG. 12. Additionally, reactive gases such as Ar—$O_2$, or other reactive gases (described below), can be introduced. One example of a sputtering system which may be used form the nano-pillar charge trap layers is the Timaris sputtering cluster tool from Singulus of Germany.

Figure 15:
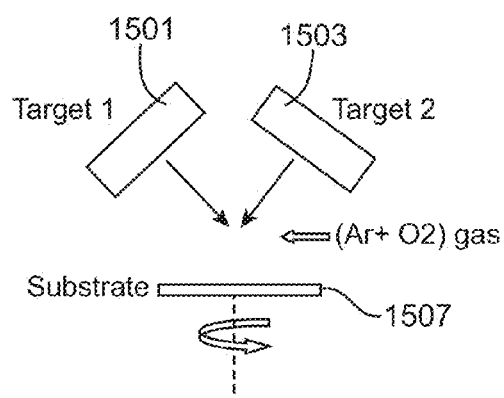
FIG. 15 shows an apparatus is shown for forming a nano-pillar charge trap layer by using at least two independent targets, targets 1501 and 1503, in accordance with an alternative embodiment of the present invention.

Referring now to FIG. 15, an apparatus is shown for forming a nano-pillar charge trap layer by using at least two independent targets, targets 1501 and 1503, in accordance with an alternative embodiment of the present invention. Each of targets 1501 and 1503 can be fired using DC- or RF-, with or without magnetron, as substrate 1507 is rotated about an axis. The preferred method for any conductive target may be a DC-magnetron target with low frequency pulsed capability. DC-magnetron target with low frequency pulsed capability may reduce arcing between targets 1501 and 1503 during deposition. Arcing may cause non-uniform process, as well as defects, in the nano-pillar charge trap layer being formed. The preferred method for any non-conductive targets may be RF-magnetron. For example, the nano-pillar charge trap layer may be formed using target 1501 of $TiO_2$, which is fired using RF-magnetron; and target 1502 of Cobalt or Cobalt-TiO2, which is fired using DC-magnetron. The power ratios of target 1501 and target 1502 may be varied independently, thereby varying the density of the trap sites.

The sputtering of FIG. 15 may be carried out using the 7100 cluster sputtering system from Cannon-Anelva of Japan. Additionally, reactive gases such as Ar—$O_2$ may be injected at different rates and for different intervals, as described below. This type of process may be well suited for making the graded design for the nano-pillar charge trap layers shown in FIG. 12, or the multi-stacked nano-pillar charge trap layers shown in FIG. 13.

Nano-pillar charge trap layers may be deposited by using sputtering processes such as DC- or RF-magnetron sputtering. An oxidizing gas may be introduced at any time during the deposition of the nano-pillar charge trap layers. In accordance with one embodiment of the present invention, nitrous oxide ($N_2O$) is introduced pre-mixed with argon gas in the ratio of 0.5 to 20 percent, while the target may be largely made of Cobalt. The gas may be activated for a time corresponding to the thickness of the nano-pillar charge trap layer being formed. Additionally, the gas flow may be turned on and off during formation, or flow may be increased or decreased at different rates. The gas may be introduced as a spike, resulting in a distribution of non-magnetic/non-conducting zones. In one embodiment, the base alloy is a magnetic alloy which may be selected from Co—Fe(1-x), where 0<x<1, and may contain additional elements from titanium (Ti), chromium (Cr), molybdenum (Mo), copper (Cu), tantalum (Ta) and boron (B). When $N_2O$ is introduced during sputtering, it may form oxides of the base alloys. It is very likely that such oxides may not be completely non-magnetic. It is important that the resulting oxides, nitrides, and any mixture of these, be non-conducting for the tunneling electrons during the program and erase process. The reactive gas may be selected from one or many of: water ($H_2O$), nitric-oxide (NO), Oxygen ($O_2$), sulfur dioxide ($SO_2$), carbon monoxide (CO), or carbon dioxide ($CO_2$). It may be important that these gases are premixed with an inert gas before entering the deposition system, either in the starting gas bottle or in the incoming gas line. The inert gas may be, for example, Argon (Ar), which may be selected due to its low cost.

Nano-pillar charge trap layers, as disclosed herein, may be used in storage units having in-plane or out-of-plane magnetic properties. In-plane refers to magnetization being in-plane with respect to the substrate. Out-of-plane refers to magnetization being substantially perpendicular with the substrate.

Figure 16:
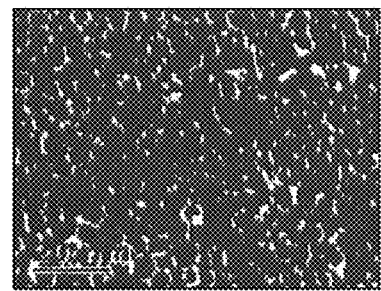
FIG. 16 shows a top down view of a nano-pillar charge trap layer, in accordance with an embodiment of the present invention.

Referring now to FIG. 16, a photo of a nano-pillar charge trap layer using transmission electron microscopy is shown. The dark grey regions are nano-pillars comprising Fe, and the light boundaries are non-conducting regions comprising $SiO_2$. It should be noted that the nano-pillars are roughly cylindrical in shape, with a pillar size of 5-10 nm.

Figure 17:
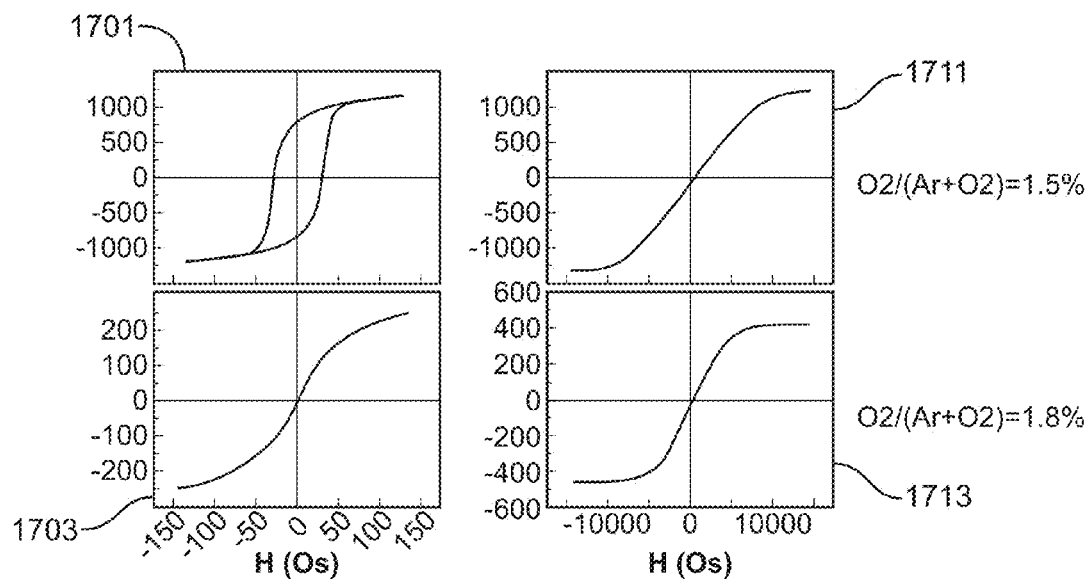
FIG. 17 shows graphs comparing the in-plane and out-of-plane magnetic properties of a nano-pillar charge trap layer using a Fe—Si target, and sputtered in the presence of reactive gas, in accordance with an embodiment of the present invention.

Referring now to FIG. 17, the magnetic properties of a Fe—$SiO_2$ nano-pillar charge trap layer are shown. FIG. 17 shows the in-plane and out-of-plane magnetic properties of a nano-charge trap layer made using Fe—Si target and sputtered in the presence of reactive gas Ar—$O_2$. In FIG. 17, graphs 1701 and 1703 show magnetic characteristics of the in-plane, and the graphs 1711 and 1713 show magnetic characteristics of the out-of-plane. When the $O_2$ is set to 1.5%, the in-plane film has a coercivity of about 50 Oe, and no coercivity for out-of-plane loop.

Figure 18:
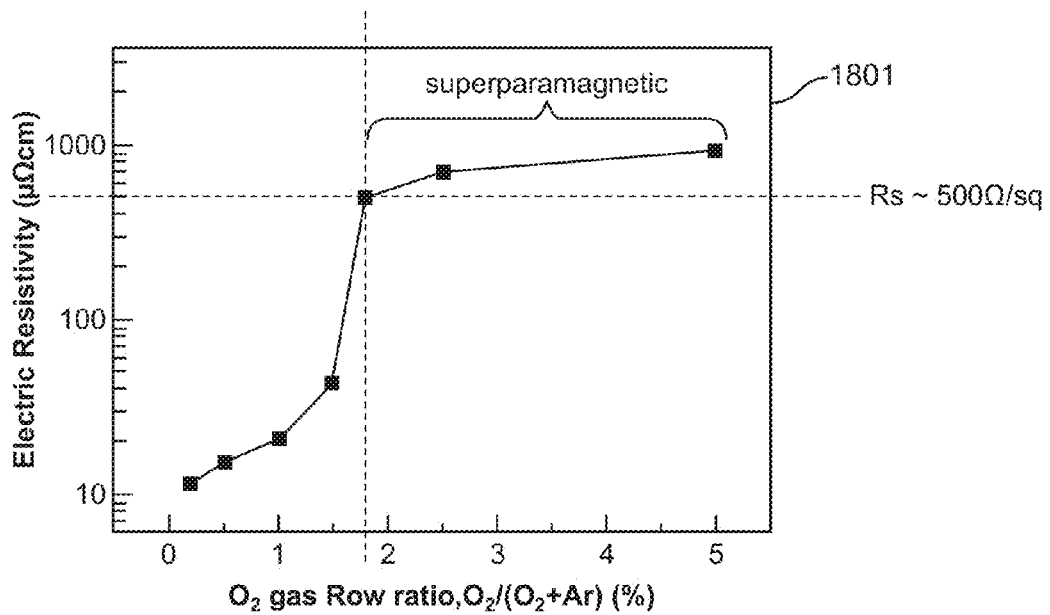
FIG. 18 shows a graph of the coercivity of a nano-pillar charge trap layer of the various embodiments of the present invention as a function of the oxygen gas flow during sputtering.

Referring now to FIG. 18, the in-plane resistivity of a Fe—$SiO_2$ nano-pillar charge trap layer sputtered in presence of Ar—$O_2$ is shown. FIG. 18 shows that when the $O_2$ gas flow ratio is increased to about 1.8%, the nano-pillar charge trap layer does not have any in-plane or out-of plane coercivity at room temperature. This indicates that the magnetic nano-pillars, formed between the non-conducting regions, are too small to support any magnetic anisotropy and are referred to as "super-paramagnetic" particles. Such sizes are typically about 5 nm when using Fe and Fe—Si alloys. FIG. 18 shows the horizontal resistivity of the Fe—SiO$_2$ film.

According to the foregoing, various embodiments of the present invention provide a simpler manufacturing and processing method than that involved in traditional floating gate deposition, resulting in a more reliable flash memory.

Further, simpler manufacturing and processing methods associated with the various embodiments of the present invention makes it less expensive to produce transistors of the present invention than the prior art flash memory with floating gate transistors.

Additionally, the use of nano-pillars to store charge may offer a further benefit over traditional floating gates due to the increase in surface area inherent to nano-pillar structures.

Although the present invention has been described in terms of specific embodiments, it is anticipated that alterations and modifications thereof will no doubt become apparent to those skilled in the art. These and other embodiments will be understood to be within the scope of the appended claims and apparent to those skilled in the art and it is therefore intended that the following claims be interpreted as covering all such alterations and modification as fall within the spirit and scope of the invention.

What is claimed is:

1. A method of storing digital information in a storage unit comprising:
   operating a storage unit having:
      a first N-diffusion well and a second N-diffusion well, the first and second N-diffusion wells separated by a P-substrate;
      a first isolation layer formed upon the first and second N-diffusion wells and the P-substrate;
      a graded nano-pillar charge trap layer including a nano-pillar charge trap layer formed upon the first isolation layer comprising conductive nano-pillars interspersed between non-conducting regions, the conductive nano pillars being cylindrical or spherical in shape being made of material comprising: Cobalt (Co), Iron (Fe), and Nickel (Ni);
      a second isolation layer formed upon the nano-pillar charge trap layer; and
      at least one word line formed upon the second isolation layer;
   wherein the nano-pillar charge trap layer is adapted to:
      operate in a first mode having associated therewith a first potential, upon application of a threshold current through the at least one word line, and to
      operate in a second mode, wherein charge is stored on the nano-pillars of the nano-pillar charge trap layer, and having associated therewith a second potential;
      wherein during the first mode, a first bit value is stored in the storage unit, and during the second mode, a second bit value is stored in the storage unit.

2. The method of storing digital information, as recited in claim 1, wherein each of the conductive nano-pillars is separated from another conductive nano-pillar by a distance of the non-conducting region.

3. The method of storing digital information, as recited in claim 1, further including a trench formed in the P-substrate, between the first and second N-diffusion wells.

4. The method of storing digital information, as recited in claim 1, further including an oxide layer formed in the P-substrate, between the first and second N-diffusion wells.

5. The method of storing digital information, as recited in claim 1, wherein the nano-pillar charge trap layer is positioned centrally between the first N-diffusion well and the second N-diffusion well such that the nano-pillar charge trap layer is vertically offset from the first and second N-diffusion wells.

6. The method of storing digital information, as recited in claim 1, wherein when voltage is applied during programming, to the storage unit, charges are trapped in the conductive nano-pillars and wherein during reading of the storage unit, the charge trapped in nano-pillars modulate to allow the storage unit to store either the first or the second bit value.

7. The method of storing digital information, as recited in claim 1, wherein the non-conducting regions are made of material comprising: oxides, nitrides, sulfides, or phosphides.

8. The method of storing digital information, as recited in claim 1, wherein the non-conducting regions are made of material comprising: oxide selected from one or more of the materials: silicon dioxide ($SiO_2$), titanium dioxide ($TiO_2$), tantalum penatoxide ($Ta_2O_5$), aluminum oxide ($Al_2O_3$), zirconium oxide ($ZrO_2$), or hafnium oxide ($HfO_2$).

9. The method of storing digital information, as recited in claim 1, wherein the non-conducting regions are made of ferro-magnetic materials comprising: $SiO_2$, $TiO_2$, $Ta_2O_5$, $Nb_2O_5$, $ZrO_2$, $HfO_2$, TiN, TaN, or $Cr_2O_3$.

10. The method of storing digital information, as recited in claim 1, wherein the conductive nano-pillars are made of material comprising: Chromium, Tantalum, Niobium, Titanium, Tungsten, Molybdenum, Rubidium, Platinum, or Palladium.

11. The method of storing digital information, as recited in claim 1, wherein the nano-pillar charge trap layer is made of Cobalt-X, where 'X' is an element comprising: chrome, tantalum, titanium or other metallic elements, such as copper or silver.

12. The method of storing digital information, as recited in claim 1, wherein the nano-pillar charge trap layer is made of Co—X-titanium dioxide ($TiO_2$), where 'X' is an element comprising: chrome, tantalum, titanium or other metallic elements, such as copper or silver.

13. A storage unit comprising:
   a first N-diffusion well and a second N-diffusion well, the first and second N-diffusion wells separated by a P-substrate;
   a first isolation layer formed upon the first and second N-diffusion wells and the P-substrate;
   a graded nano-pillar charge trap layer including a nano-pillar charge trap layer formed upon the first isolation layer comprising conductive nano-pillars interspersed between non-conducting regions, the conductive nano-pillars being cylindrical or spherical in shape and made of material comprising: Cobalt (Co), Iron (Fe), and Nickel (Ni);
   a second isolation layer formed upon the nano-pillar charge trap layer; and
   at least one word line formed upon the second isolation layer;
   wherein the nano-pillar charge trap layer is adapted to:
      operate in a first mode having associated therewith a first potential, upon application of a threshold current through the at least one word line, and to
      operate in a second mode, wherein charge is stored on the nano-pillars of the nano-pillar charge trap layer, and having associated therewith a second potential;
      wherein during the first mode, a first bit value is stored in the storage unit, and during the second mode, a second bit value is stored in the storage unit.

14. The storage unit, as recited in claim 13, wherein each of the conductive nano-pillars is separated from another conductive nano-pillar by a distance of the non-conducting region.

15. The storage unit, as recited in claim 13, further including a trench formed in the P-substrate, between the first and second N-diffusion wells.

16. The storage unit, as recited in claim 13, further including an oxide layer formed in the P-substrate, between the first and second N-diffusion wells.

17. The storage unit, as recited in claim 13, wherein the nano-pillar charge trap layer is positioned centrally between the first N-diffusion well and the second N-diffusion well such that the nano-pillar charge trap layer is vertically offset from the first and second N-diffusion wells.

18. The storage unit, as recited in claim 13, wherein when voltage is applied during programming, to the storage unit, charges are trapped in the conductive nano-pillars and wherein during reading of the storage unit, the charge trapped in nano-pillars modulate to allow the storage unit to store either the first or the second bit value.

19. The storage unit, as recited in claim 13, wherein the non-conducting regions are made of material comprising: oxides, nitrides, sulfides, or phosphides.

20. The storage unit, as recited in claim 13, wherein the non-conducting regions further include at least one of the following materials: Chromium (Cr), Tantalum (Ta), Titanium (Ti), Niobium (Nb), or Molybdenum (Mo).

21. The method of storing digital information, as recited in claim 1, wherein the non-conducting regions further include at least one of the following materials: Chromium (Cr), Tantalum (Ta), Titanium (Ti), Niobium (Nb), or Molybdenum (Mo).

* * * * *